United States Patent
Joo et al.

(10) Patent No.: US 11,810,864 B2
(45) Date of Patent: Nov. 7, 2023

(54) SEMICONDUCTOR PACKAGE

(71) Applicant: SAMSUNG ELECTRONICS CO., LTD., Suwon-si (KR)

(72) Inventors: Changeun Joo, Cheonan-si (KR); Gyujin Choi, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/849,938

(22) Filed: Jun. 27, 2022

(65) Prior Publication Data
US 2022/0328415 A1    Oct. 13, 2022

Related U.S. Application Data

(63) Continuation of application No. 17/032,210, filed on Sep. 25, 2020, now Pat. No. 11,373,955.

(30) Foreign Application Priority Data

Feb. 25, 2020   (KR) ........................ 10-2020-0022838

(51) Int. Cl.
*H01L 23/538*   (2006.01)
*H01L 23/498*   (2006.01)
*H01L 21/56*    (2006.01)

(52) U.S. Cl.
CPC .... *H01L 23/5386* (2013.01); *H01L 23/49816* (2013.01); *H01L 23/5383* (2013.01); *H01L 21/565* (2013.01)

(58) Field of Classification Search
CPC ........... H01L 23/5386; H01L 23/49816; H01L 23/5383; H01L 21/565

USPC ........................................................ 257/666
See application file for complete search history.

(56) References Cited

U.S. PATENT DOCUMENTS

| 8,238,113 B2 | 8/2012  | Iihola et al. |
| 8,264,849 B2 | 9/2012  | Guzek et al. |
| 8,710,668 B2 | 4/2014  | Lee et al. |
| 9,041,211 B2 | 5/2015  | Uchiyama |
| 9,472,533 B2 | 10/2016 | Pendse |

(Continued)

FOREIGN PATENT DOCUMENTS

| JP | 5864180 B2     | 1/2016 |
| KR | 10-1994748 B1  | 7/2019 |

*Primary Examiner* — Vu A Vu
(74) *Attorney, Agent, or Firm* — Lee IP Law, P.C.

(57) ABSTRACT

A semiconductor package includes a core substrate having a through hole, a first molding member at least partially filling the through hole and covering an upper surface of the core substrate, the first molding member having a cavity within the through hole, a first semiconductor chip on the first molding member on the upper surface of the core substrate, a second semiconductor chip arranged within the cavity, a second molding member on the first molding member and covering the first semiconductor chip, a third molding member filling the cavity and covering the lower surface of the core substrate; first redistribution wirings on the second molding member and electrically connecting first chip pads of the first semiconductor chip and core connection wirings of the core substrate; and second redistribution wirings on the third molding member and electrically connecting second chip pads of the second semiconductor chip and the core connection wirings.

19 Claims, 35 Drawing Sheets

(56) References Cited

U.S. PATENT DOCUMENTS

| | | |
|---|---|---|
| 9,502,391 B2 | 11/2016 | Kwon et al. |
| 9,679,873 B2 | 6/2017 | Keser et al. |
| 9,735,131 B2 * | 8/2017 | Su .......................... H01L 25/50 |
| 9,935,087 B2 | 4/2018 | Zhai et al. |
| 10,157,886 B2 | 12/2018 | Park et al. |
| 10,304,807 B2 | 5/2019 | Park et al. |
| 11,373,955 B2 * | 6/2022 | Joo ..................... H01L 21/4857 |
| 11,380,620 B2 * | 7/2022 | Wu ..................... H01L 23/5389 |
| 2012/0104606 A1 * | 5/2012 | Okuda ................. H01L 21/568 |
| | | 257/738 |
| 2018/0005984 A1 * | 1/2018 | Yu ....................... H01L 25/0655 |
| 2018/0315737 A1 | 11/2018 | Meyer et al. |
| 2019/0259630 A1 | 8/2019 | Chen et al. |
| 2020/0006308 A1 * | 1/2020 | Kuo ....................... H01L 24/17 |

* cited by examiner

FIG. 2
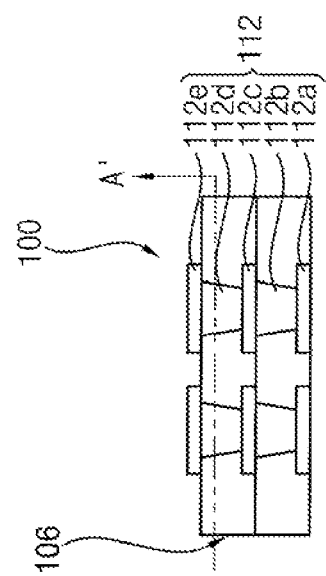
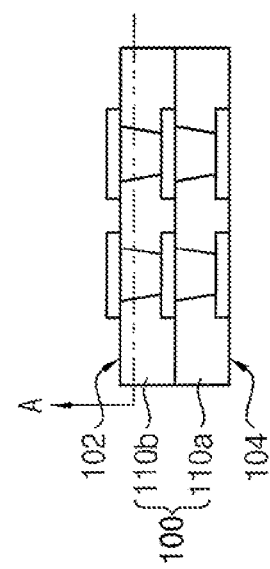

SEMICONDUCTOR PACKAGE

CROSS-REFERENCE TO RELATED APPLICATIONS

This application is a continuation of pending U.S. patent application Ser. No. 17/032,210, filed on Sep. 25, 2020, the entire contents of which is hereby incorporated by reference.

Korean Patent Application No. 10-2020-0022838, filed on Feb. 25, 2020, in the Korean Intellectual Property Office, and entitled: "Semiconductor Package and Method of Manufacturing the Semiconductor Package," is incorporated by reference herein in its entirety.

BACKGROUND

1. Field

Embodiments relate to a semiconductor package and a method of manufacturing the semiconductor package.

2. Description of the Related Art

In a fan-out package, electrical connection terminals may be arranged in a fan out region outside an area where a semiconductor chip is arranged. In case of the fan-out package, it may be difficult and expensive to implement a stack package including different semiconductor chips stacked therein.

SUMMARY

Embodiments are directed to a semiconductor package, including a core substrate having a through hole; a first molding member at least partially filling the through hole and covering an upper surface of the core substrate, the first molding member having a cavity that is provided within the through hole to extend in a thickness direction from a lower surface of the core substrate; a first semiconductor chip arranged on the first molding member on the upper surface of the core substrate; a second semiconductor chip arranged within the cavity of the first molding member; a second molding member on the first molding member and covering the first semiconductor chip; a third molding member filling the cavity and covering the lower surface of the core substrate; first redistribution wirings on the second molding member and electrically connecting first chip pads of the first semiconductor chip and core connection wirings of the core substrate; second redistribution wirings on the third molding member and electrically connecting second chip pads of the second semiconductor chip and the core connection wirings of the core substrate; and a lower redistribution wiring layer on the third molding member and having lower redistribution wirings electrically connected to the second redistribution wirings, respectively. At least one of the first, second and third molding members may include a photo imageable dielectric material.

Embodiments are also directed to a semiconductor package, including a core substrate having a first surface and a second surface opposite to each other and having a through hole that extends from the first surface to the second surface; a first molding member having a first portion covering the first surface of the core substrate and a second portion covering an inner sidewall of the through hole, the second portion having a cavity that is provided within the through hole to be exposed from the second surface of the core substrate; a first semiconductor chip arranged on the first molding member on the first surface of the core substrate; a second semiconductor chip arranged within the cavity of the first molding member; a second molding member on the first molding member on the first surface of the core substrate and covering the first semiconductor chip; a third molding member on the second surface of the core substrate, filling the cavity of the first molding member and covering the second semiconductor chip; first redistribution wirings on the second molding member and electrically connecting first chip pads of the first semiconductor chip and core connection wirings of the core substrate; second redistribution wirings on the third molding member and electrically connecting second chip pads of the second semiconductor chip and the core connection wirings of the core substrate; and a lower redistribution wiring layer on the third molding member and having lower redistribution wirings electrically connected to the second redistribution wirings, respectively.

Embodiments are also directed to a semiconductor package, including a core substrate having a through hole; a first molding member at least partially filling the through hole and covering an upper surface of the core substrate, the first molding member having a cavity that is provided within the through hole to extend in a thickness direction from a lower surface of the core substrate; a first semiconductor chip arranged on the first molding member on the upper surface of the core substrate; a second semiconductor chip arranged within the cavity of the first molding member; a second molding member on the first molding member and covering the first semiconductor chip; a third molding member filling the cavity and covering the lower surface of the core substrate; first redistribution wirings on the second molding member and electrically connecting first chip pads of the first semiconductor chip and core connection wirings of the core substrate; and second redistribution wirings on the third molding member and electrically connecting second chip pads of the second semiconductor chip and the core connection wirings of the core substrate.

BRIEF DESCRIPTION OF THE DRAWINGS

Features will become apparent to those of skill in the art by describing in detail example embodiments with reference to the attached drawings in which:

FIGS. 2 and 4 to 18 are cross-sectional views illustrating stages in a method of manufacturing a semiconductor package in accordance with an example embodiment.

DETAILED DESCRIPTION

Figure 1:
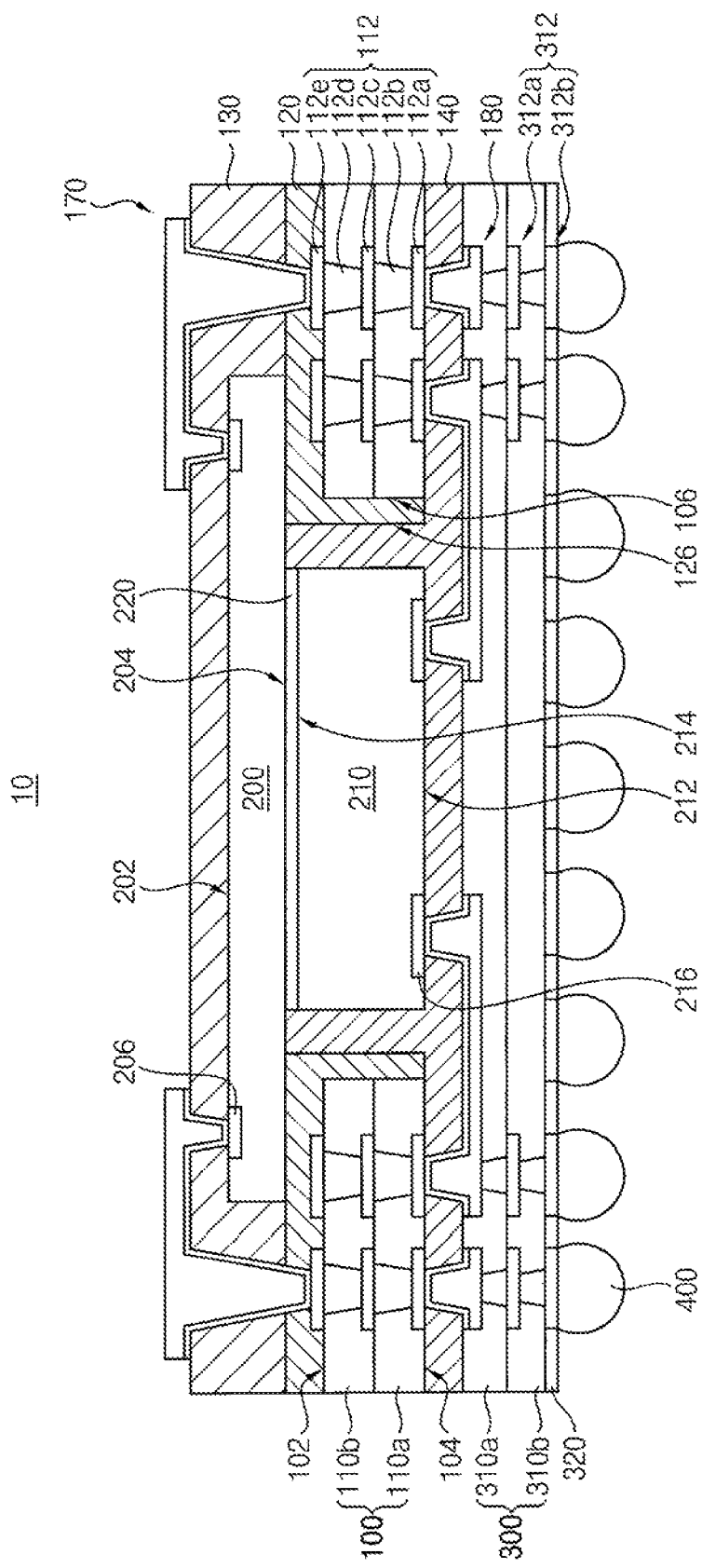
FIG. 1 is a cross-sectional view illustrating a semiconductor package in accordance with an example embodiment.

FIG. 1 is a cross-sectional view illustrating a semiconductor package in accordance with an example embodiment.

Referring to FIG. 1, a semiconductor package 10 may include a core substrate 100, first to third molding members 120, 130, 140, first and second semiconductor chips 200, 210, first redistribution wirings 170 and second redistribution wirings 180, a lower redistribution wiring layer 300, and outer connection members.

In an example embodiment, the semiconductor package 10 may include the core substrate 100 provided as a base substrate on which the first and second semiconductor chips 200, 210 are stacked. The core substrate 100 may include core connection wirings 112 that are provided in a fan out region outside an area where the first semiconductor chip 200 or the second semiconductor chip 210, to function as an electrical connection path with the first and second semiconductor chips. Accordingly, the semiconductor package 10 may be provided as a fan-out package. Additionally, the semiconductor package 10 may be provided as a stack package including the first and second semiconductor chips 200, 210 stacked via the core substrate 100.

Further, the semiconductor package 10 may be provided as a System In Package (SIP). For example, the second semiconductor chip 210 may be a logic chip including logic circuits and the first semiconductor chip 200 may be a memory chip. The logic chip may be a controller to control the memory chip. The memory chip may include various memory circuits such as DRAM, SRAM, flash, PRAM, ReRAM, FeRAM, MRAM, or the like.

In an example embodiment, the core substrate 100 may have a first surface (upper surface) 102 and a second surface (lower surface) 104 opposite to each other. The core substrate 100 may have a through hole 106 in a middle region thereof. The through hole 106 may extend from the first surface 102 to the second surface 104 of the core substrate 100. The through hole 106 may completely penetrate the core substrate 100.

The core substrate 100 may include a plurality of stacked insulation layers 110a, 110b and core connection wirings 112 provided in the insulation layers. A plurality of the core connection wirings 112 may be provided in the fan out region outside the area where the semiconductor chip (die) is disposed, to be used for electrical connection with the semiconductor chip.

For example, the core substrate 100 may include a first insulation layer 110a and a second insulation layer 110b stacked on the first insulation layer 110a. The core connection wiring 112 may include a first metal wiring 112a, a first contact 112b, a second metal wiring 112c, a second contact 112d, and a third metal wiring 112e. The first metal wiring 112a may be provided in the second surface 104 of the core substrate 100, that is, a lower surface of the first insulation layer 110a, and at least a portion of the first metal wiring 112a may be exposed from the second surface 104. The third metal wiring 112e may be provided in the first surface 102 of the core substrate 100, that is, an upper surface of the second insulation layer 110b, and at least a portion of the third metal wiring 112e may be exposed from the first surface 102. It may be understood that the number and arrangements of the insulation layers and the core connection wirings of the core substrate 100 may be varied.

The first molding member 120 may cover the first surface 102 of the core substrate 100 and may fill, for example, partially, the through hole 106. The first molding member 120 may have a cavity 126 that extends in a thickness direction (a vertical direction in FIG. 1) from the second surface 104 of the core substrate 100 toward the second molding member 130. For example, the first molding member 120 may be disposed in the through hole 106 of the core substrate 100 such that the first molding member extends in the thickness direction from the second surface 104 of the core substrate 100 to, or above, the first surface 102 of the core substrate 100.

The first molding member 120 may include a first portion covering the first surface 102 of the core substrate 100 and a second portion covering an inner sidewall of the through hole 106 of the core substrate 100. The second portion of the first molding member 120 may have the cavity 126 that is provided within the through hole 106 and exposed from the second surface 104 of the core substrate 100.

An upper surface of the first molding member 120 may be located on a plane that is higher than the first surface 102 of the core substrate 100, and a lower surface of the first molding member 120 may be coplanar with the second surface 104 of the core substrate 100.

The cavity 126 may extend in a thickness direction from the lower surface of the first molding member 120, that is, the second surface 104 of the core substrate 100, to a predetermined depth. For example, the cavity 126 may be provided to penetrate, for example, completely, through the first molding member 120.

The first molding member 120 may include, for example, an insulation material such as epoxy resin. The first molding member 120 may include, for example, a photo imageable dielectric (PID) material.

The first semiconductor chip 200 may be arranged on the first molding member 120 on the first surface 102 of the core substrate 100. The first semiconductor chip 200 may include first chip pads 206 on a first surface 202, that is, an active surface thereof. The first semiconductor chip 200 may be arranged such that a backside, that is, a second surface 204 opposite to the first surface 202 on which the first chip pads 206 are formed faces toward the first molding member 120. The first semiconductor chip 200 may be adhered on the first molding member 120 by an adhesive film (not illustrated).

The first semiconductor chip 200 may be arranged corresponding to the through hole 106 of the core substrate 100 and the cavity 126 of the first molding member 120. An area of the first semiconductor chip 200 may be greater than an area of the cavity 26 of the first molding member 120. Accordingly, a middle region of the second surface 204 of the first semiconductor chip 200 may be exposed by the cavity 126.

The second semiconductor chip 210 may be arranged within the cavity 126 of the first molding member 120. The second semiconductor chip 210 may be arranged corresponding to the first semiconductor chip 200. The second semiconductor chip 210 may be arranged to be spaced apart from an inner sidewall of the cavity 126.

The second semiconductor chip 210 may include second chip pads 216 on a first surface 212, that is, an active surface thereof. The second semiconductor chip 210 may be arranged within the cavity 126 such that the first surface 212 on which the second chip pads 216 are formed faces downward or toward the lower redistribution wiring layer 300. The second chip pads 216 may be exposed from the second surface 104 of the core substrate 100. The first surface 212 of the second semiconductor chip 210 may be coplanar with the second surface 104 of the core substrate 100.

The second surface 204, that is, the backside of the first semiconductor chip 200 and the second surface 214, that is, a backside of the second semiconductor chip 210 may face each other. An adhesive film 220 may be interposed between the second surface 204 of the first semiconductor chip 200 and the second surface 214 of the second semiconductor chip 210. The adhesive film 220 may include, for example, a die attach film (DAF).

The second molding member 130 may be provided on the first molding member 120 on the first surface 102 of the core substrate 100 to cover the first semiconductor chip 200. Thus, the first surface 202 of the first semiconductor chip 200 may be covered by the second molding member 130.

The second molding member 130 may include, for example, an insulation material such as epoxy resin. The second molding member 130 may include, for example, a photo imageable dielectric (PID) material. The second molding member 130 may include a material that is the same as or different from the first molding member 120.

The third molding member 140 may cover the second surface 104 of the core substrate 100 and fill the cavity 126. The third molding member 140 may be provided to fill a space between a sidewall of the second semiconductor chip 210 and the inner sidewall of the cavity 126. The third molding member 140 may include a third portion covering the second surface 104 of the core substrate 100, a fourth portion covering the inner sidewall of the cavity 126 of the first molding member 120, and a fifth portion covering the first surface 212 of the second semiconductor chip 210.

The third molding member 140 may include, for example, an insulation material such as epoxy resin. The third molding member 140 may include, for example, a photo imageable dielectric (PID) material. The third molding member 140 may include a material that is the same as or different from the first and second molding members 120, 130.

The first redistribution wiring 170 may be arranged on the second molding member 130, and may be electrically connected to the first chip pad 206 of the first semiconductor chip 200 and the core connection wiring 112 of the core substrate 100 through openings formed in the second molding member 130. The first redistribution wiring 170 may be provided on the first surface 102 of the core substrate 100 to function as a backside redistribution wiring.

Some of the first redistribution wiring 170 may be electrically connected to only the core connection wiring 112. The first redistribution wiring may include, for example, aluminum (Al), copper (Cu), tin (Sn), nickel (Ni), gold (Au), platinum (Pt), or an alloy thereof.

The second redistribution wiring 180 may be arranged on the third molding member 130, and may be electrically connected to the second chip pad 216 of the second semiconductor chip 210 and the core connection wiring 112 of the core substrate 100 through openings formed in the third molding member 140. The second redistribution wiring 180 may be provided on the second surface 104 of the core substrate 100 to function as a front side redistribution wiring.

Some of the second redistribution wiring 180 may be electrically connected to only the core connection wiring 112 or the second chip pad 216. The second redistribution wiring may include, for example, aluminum (Al), copper (Cu), tin (Sn), nickel (Ni), gold (Au), platinum (Pt), or an alloy thereof.

In an example embodiment, the lower redistribution wiring layer 300 may be provided on the third molding member 140 to cover the first surface 212 of the second semiconductor chip 210 and the second surface 104 of the core substrate 100. The lower redistribution wiring layer 300 may have lower redistribution wirings 312 electrically connected to the second redistribution wirings 180, respectively.

In an example embodiment, the lower redistribution wiring layer 300 may include a first lower insulation layer 310a provided on the third molding member 140 and having openings that expose the second redistribution wirings 180, and first lower redistribution wirings 312a provided on the first lower insulation layer 310a and at least portions of which make contact with the second redistribution wirings 180 through the openings.

The lower redistribution wiring layer 300 may include a second lower insulation layer 310b provided on the first lower insulation layer 310a and having openings that expose the first lower redistribution wirings 312a. The lower redistribution wiring layer 300 may include second lower redistribution wirings 312b provided on the second lower insulation layer 310b and at least portions of which make contact with the first lower redistribution wirings 312a through the openings.

The lower redistribution wiring layer 300 may include a protective layer 320 on the second lower insulation layer 310b and exposing at least a portion of the second lower redistribution wiring 312b. In an example embodiment, the portion of the second lower redistribution wiring 312b may function as a landing pad, that is, a package pad.

It may be understood that the number, sizes, arrangements, etc. of the lower insulation layers of the lower redistribution wiring layer are illustrated as examples and may be varied.

The outer connection members 400 may be disposed on the package pads on an outer surface of the lower redistribution wiring layer 300. For example, the outer connection member 400 may include a solder ball. The solder ball may have a diameter of, for example, 300 μm to 500 μm.

Some of the lower redistribution wirings 312 of the lower redistribution wiring layer 300 and some of the second redistribution wirings 180 may serve as a first input/output signal line for the second semiconductor chip 210. Some of the lower redistribution wirings 312 of the lower redistribution wiring layer 300, some of the second redistribution wirings 180, some of the core connection wirings 112, and some of the first redistribution wirings 170 may serve as a second input/output signal line for the first semiconductor chip 200. Some of the second redistribution wirings 180, some of the core connection wirings 112, and some of the first redistribution wirings 170 may serve as an electrical connection line between the first and second semiconductor chips 200, 210.

As described above, the semiconductor package 10 may be a fan-out panel level package, and may include the core substrate 100 provided in an outer region of the second semiconductor chip 210 and the lower redistribution wiring layer 300 covering the second surface 104 of the core substrate 100. The semiconductor package 10 as the stack package may include the first and second semiconductor chips 200, 210 stacked therein.

Thus, the semiconductor package 10 may be provided as the stack package of the first and second semiconductor chips 200, 210 stacked via the core substrate 100 as a support frame for the fan-out panel level package to thereby realize high bandwidth and high density. The first and second semiconductor chips 200, 210 may be electrically connected to each other through the first and second redistribution wirings 170, 180 on the front side and the backside of the core substrate 100 so that signal transmission lengths are shortened to thereby optimize signal integrity (SI).

Hereinafter, a method of manufacturing the semiconductor package in FIG. 1 will be described.

Figure 3:
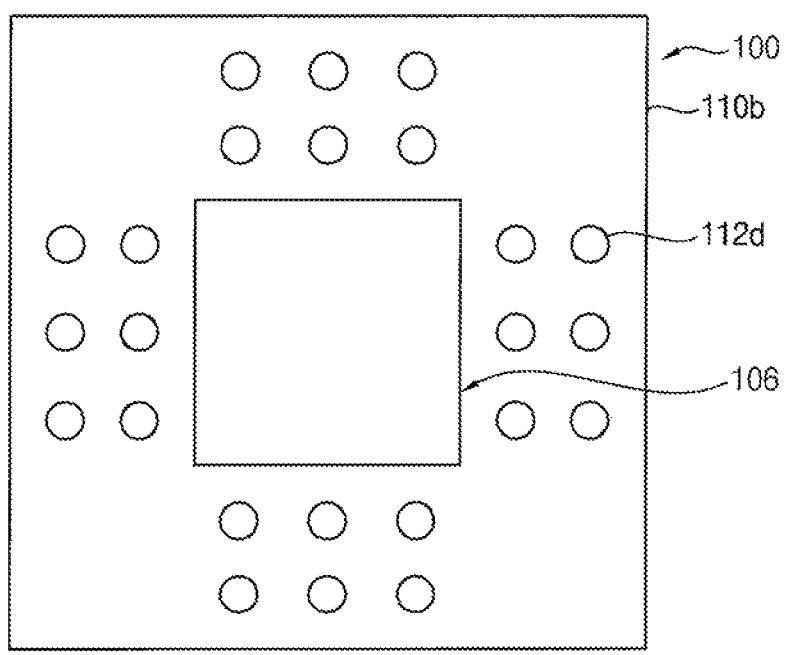
FIG. 3 is a cross-sectional plan view of FIG. 2.

FIGS. 2 and 4 to 18 are cross-sectional views illustrating stages in a method of manufacturing a semiconductor package in accordance with an example embodiment. FIG. 3 is a sectional plan view taken along the line A-A' in FIG. 2.

Figure 4:
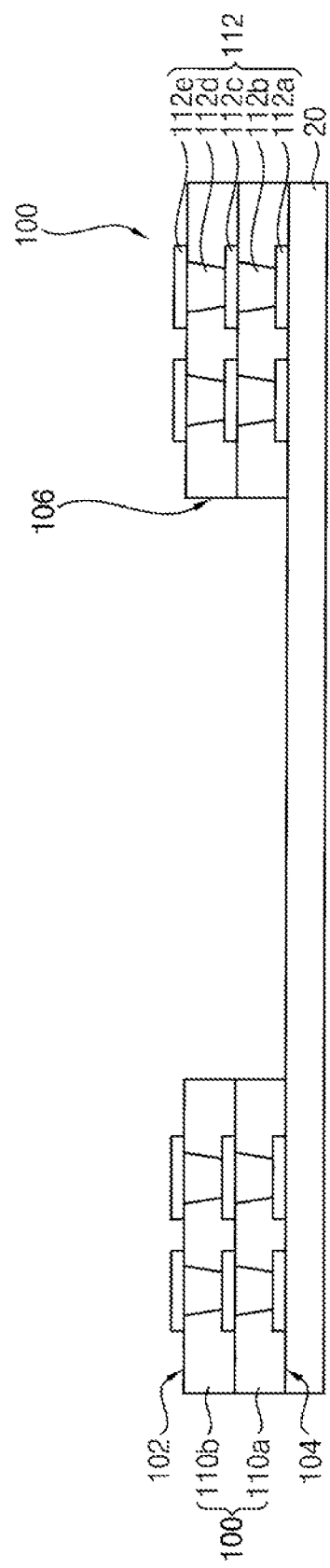

Referring to FIGS. 2 to 4, a core substrate 100 having a through hole 106 may be adhered on a barrier tape 20.

In an example embodiment, the core substrate 100 may be used as a support frame for electrical connection on which a plurality of semiconductor chips is arranged to manufacture semiconductor packages having a fan-out panel level package configuration.

The core substrate 100 may have a first surface 102 and a second surface 104 opposite to each other. The core substrate 100 may include a plurality of stacked insulation layers 110a, 110b and core connection wirings 112 provided in the insulation layers. A plurality of the core connection wirings 112 may be provided to penetrate through the core substrate 100 from the first surface 102 to the second surface 104 of the core substrate 100 to function as an electrical connection path. The core connection wirings 112 may be provided in a fan out region, outside an area where the semiconductor chip (die) is disposed, to be used for electrical connection with the semiconductor chip mounted therein.

The core substrate 100 may include, for example, a first insulation layer 110a and a second insulation layer 110b stacked on the first insulation layer 110a. The core connection wiring 112 may include a first metal wiring 112a, a first contact 112b, a second metal wiring 112c, a second contact 112d and a third metal wiring 112e. The first metal wiring 112a may be provided in the second surface 104 of the core substrate 100, that is, a lower surface of the first insulation layer 110a, and at least a portion of the first metal wiring 112a may be exposed from the second surface 104. The third metal wiring 112e may be provided in the first surface 102 of the core substrate 100, that is, an upper surface of the second insulation layer 110b, and at least a portion of the third metal wiring 112e may be exposed from the first surface 102. It may be understood that the number and arrangements of the insulation layers and the core connection wirings may be varied.

The core substrate 100 may be arranged on the barrier tape 20. The second surface 104 of the core substrate 100 may be adhered on the barrier tape 20. The barrier tape 20 may have a panel shape. For example, about 200 to about 6,000 dies may be arranged in respective through holes 106 of the core substrate 100. As described later, a singulation process may be performed to saw the core substrate to complete a fan-out panel level package.

Figure 5:
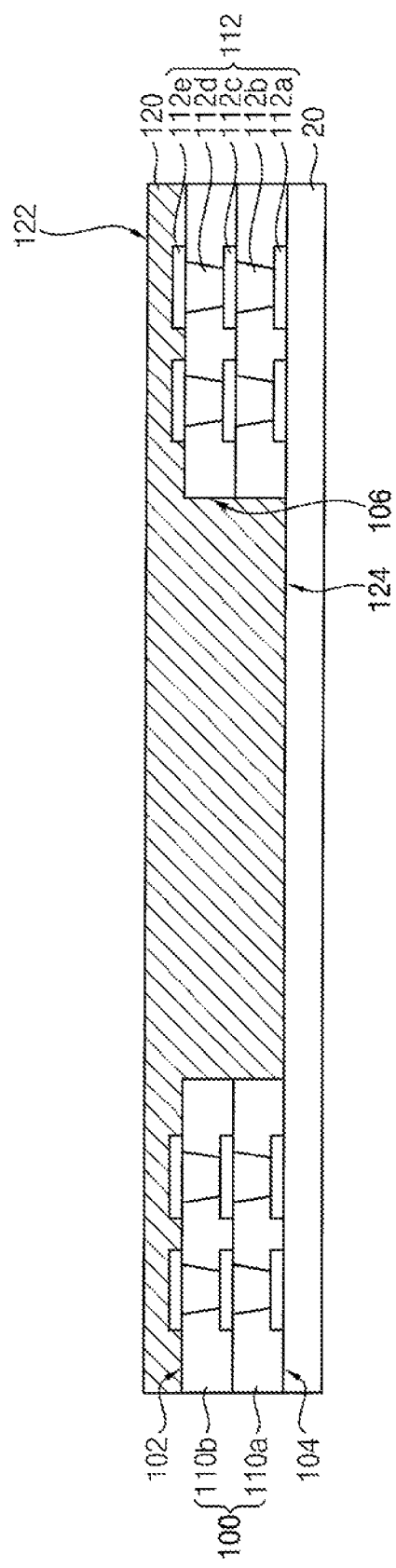

Referring to FIG. 5, a first molding member 120 may be formed on the first surface 102 of the core substrate 100 to fill the through hole 106.

For example, the first molding member 120 may be formed on the first surface 102 of the core substrate 100 to completely fill the through hole 106. Thus, the first surface 102 of the core substrate 100 may be covered by the first molding member 120.

The first molding member 120 may include, for example, an insulation material such as epoxy resin. The first molding member 120 may include, for example, a photo imageable dielectric (PID) material.

A first surface 122 of the first molding member 120 may be located on a plane that is higher than the first surface 102 of the core substrate 100, and a second surface 124 of the first molding member 120 may be coplanar with the second surface 104 of the core substrate 100.

Figure 6:
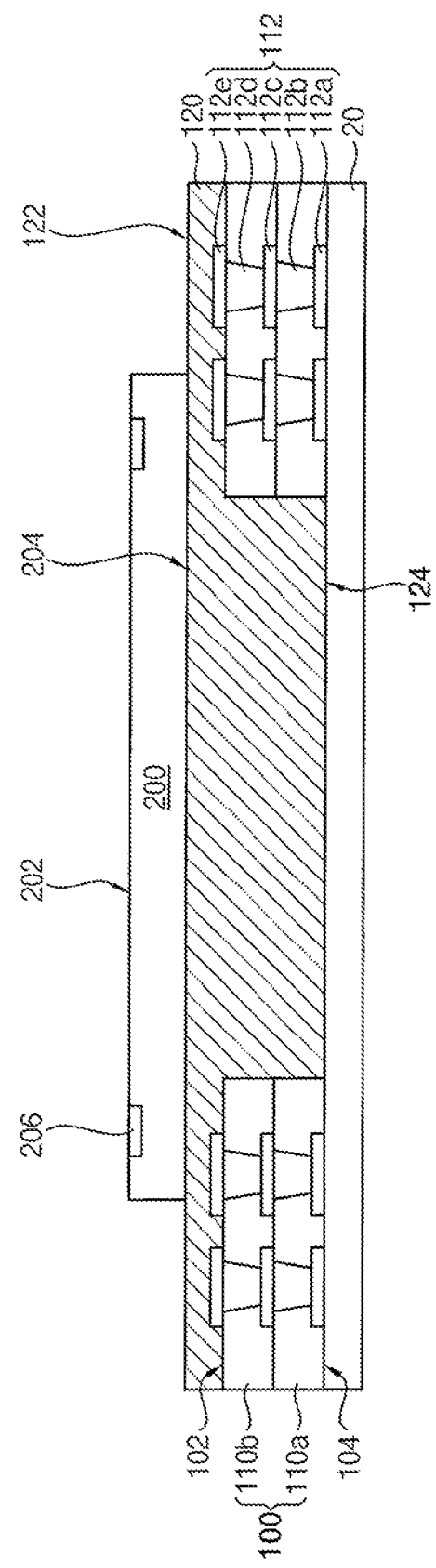
Figure 7:
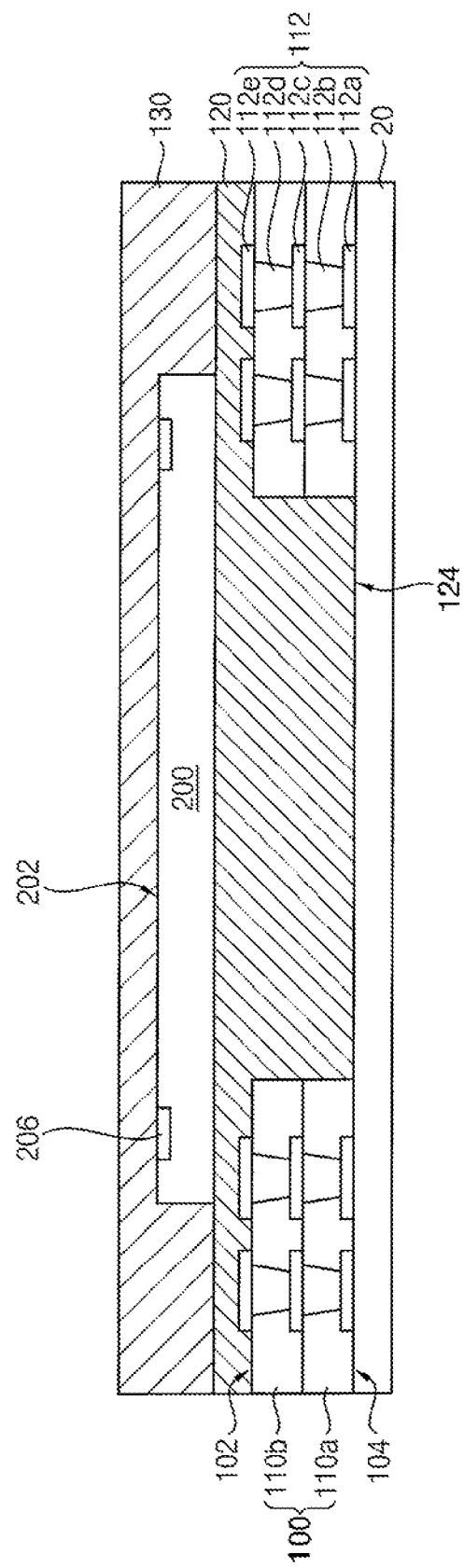

Referring to FIGS. 6 and 7, a first semiconductor chip 200 may be disposed on the first molding member 120, and then, a second molding member 130 may be formed on the first molding member 120 on the first surface 102 of the core substrate 100 to cover the first semiconductor chip 200.

The first semiconductor chip 200 may include a first substrate and first chip pads 206 on an active surface, that is, a first surface 202 of the first substrate. The first semiconductor chip 200 may be adhered on the first molding member 120 by an adhesive film (not illustrated). The first semiconductor chip 200 may be arranged such that a backside, that is, a second surface 204 opposite to the first surface 202 on which the first chip pads 206 are formed, faces toward the first molding member 120. The first semiconductor chip 200 may be arranged corresponding to the through hole 106 of the core substrate 100.

Then, as illustrated in FIG. 7, the second molding member 130 may be formed on the first surface 122 of the first molding member 120 (which is on the first surface 102 of the core substrate 100) to cover the first semiconductor chip 200. Thus, the first surface 202 of the first semiconductor chip 200 may be covered by the second molding member 130.

The second molding member 130 may include, for example, an insulation material such as epoxy resin. The second molding member 130 may include, for example, a photo imageable dielectric (PID) material. The second molding member 130 may include a material that is the same as or different from the first molding member 120.

Figure 8:
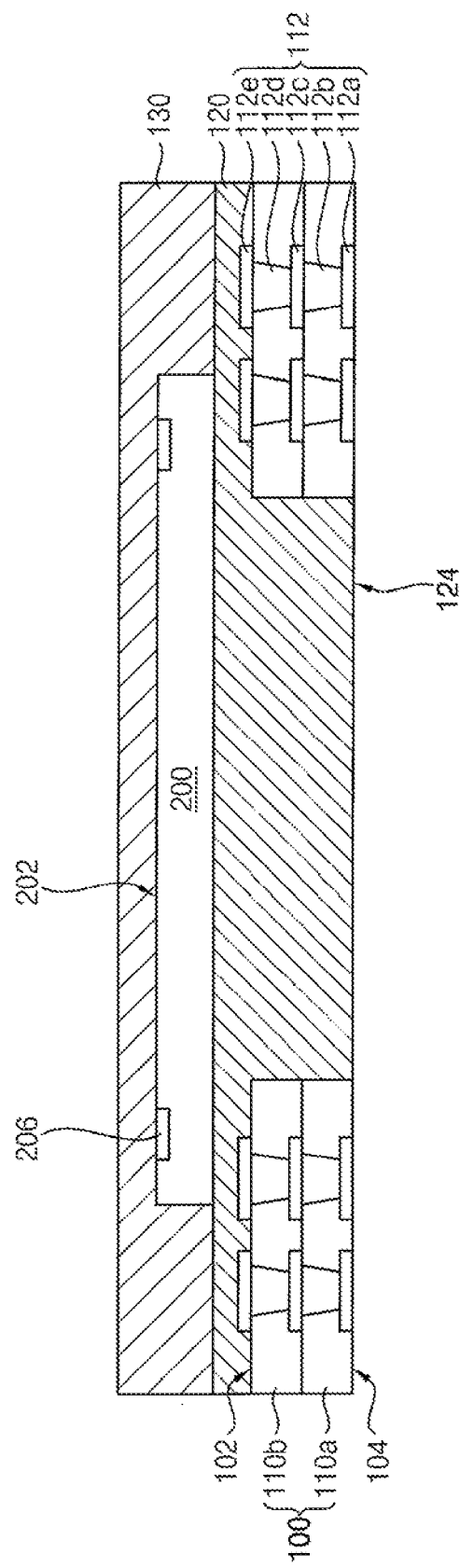
Figure 9:
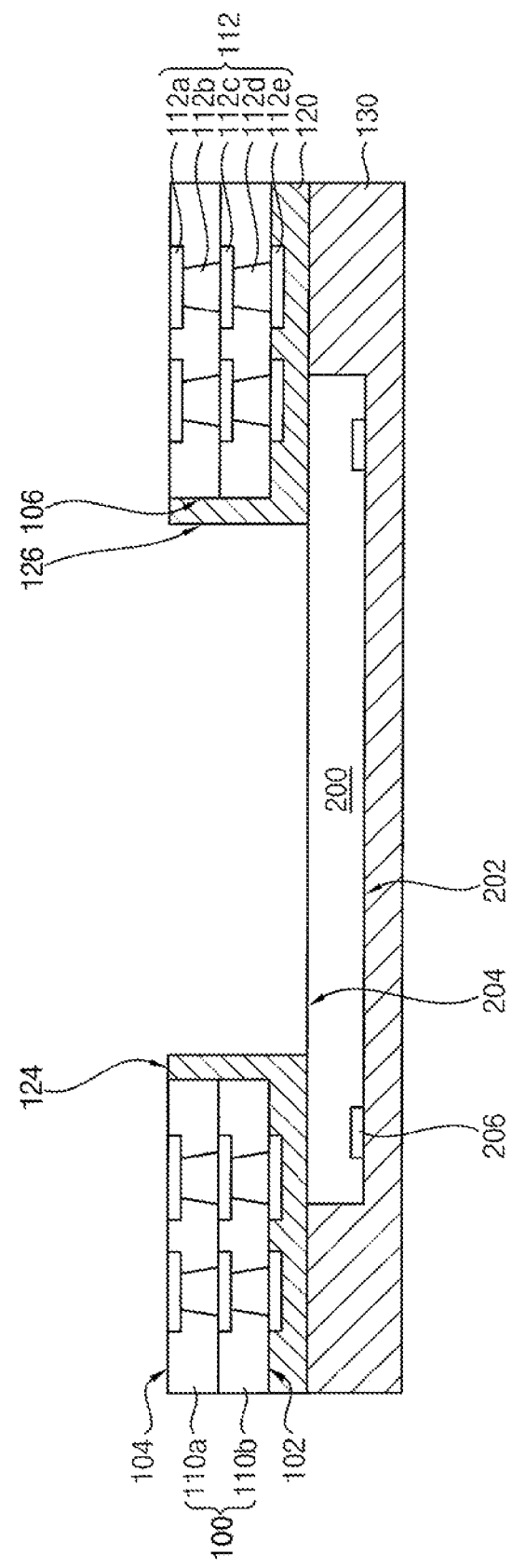

Referring to FIGS. 8 and 9, after removing the barrier tape 20, the structure in FIG. 8 may be reversed or inverted, and then, a cavity 126 may be formed in the first molding member 120.

By removing the barrier tape 20, the second surface 124 of the first molding member 120 may be exposed through the through hole 106 of the core substrate 100. A laser ablation process may be performed on the second surface 124 of the first molding member 120 exposed through the through hole 106 to form the cavity 126 in the first molding member 120.

The cavity 126 may be formed to extend in a thickness direction from the second surface 124 of the first molding member 120. The cavity 126 may extend from the second surface 124 to the first surface 122 of the first molding member 120 to expose the second surface 204 of the first semiconductor chip 200.

An inner sidewall of the cavity 126 may be spaced apart from an inner sidewall of the through hole 106 of the core substrate 100. Accordingly, a first portion of the first molding member 120 may be formed on the first surface 102 of the core substrate 100, and a second portion of the first molding member 120 may be formed on the inner sidewall of the through hole 106 of the core substrate 100.

Figure 10:
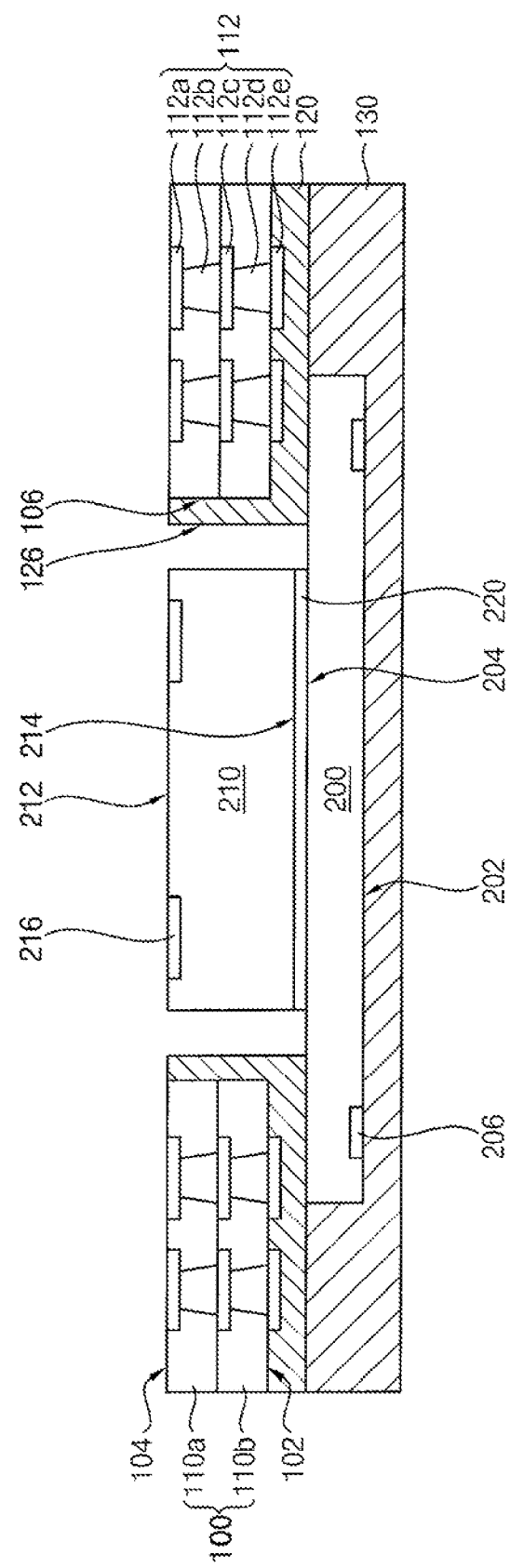
Figure 11:
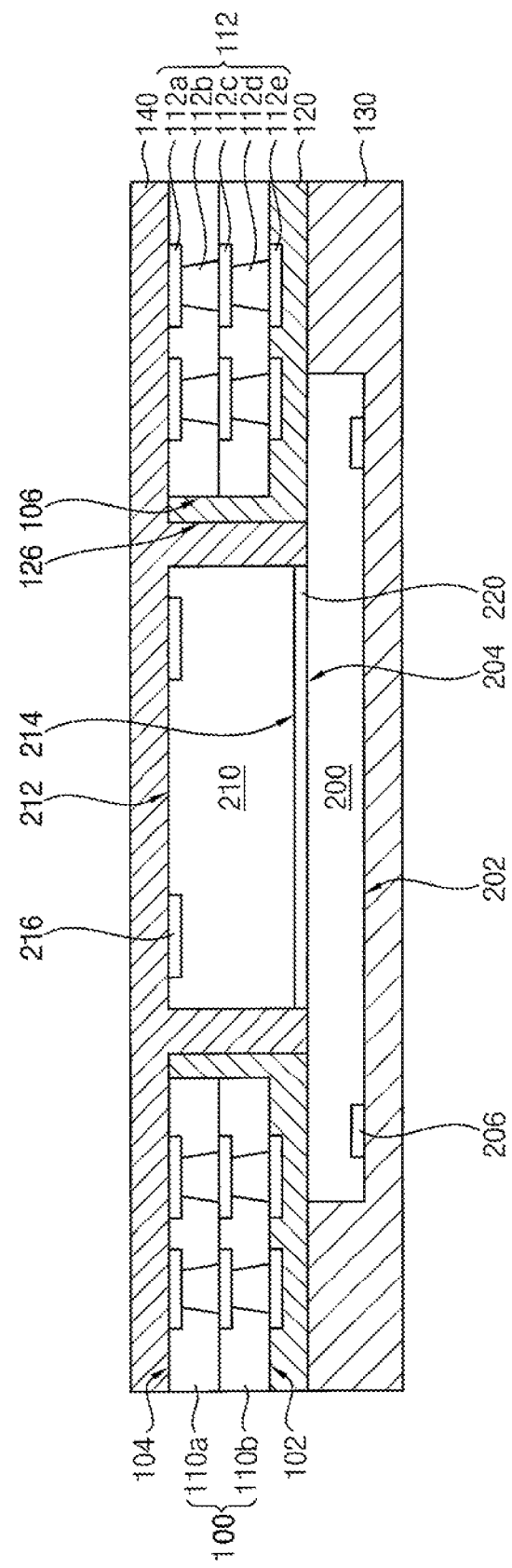

Referring to FIGS. 10 and 11, a second semiconductor chip 210 may be arranged within the cavity 126 of the first molding member 120, and then, a third molding member 140 may be formed on the second surface 104 of the core substrate 100 to cover the second semiconductor chip 210.

The second semiconductor chip 210 may be disposed within the cavity 126 of the first molding member 120. A sidewall of the second semiconductor chip 210 may be spaced apart from the inner sidewall of the cavity 126.

Accordingly, a space may be formed between the sidewall of the second semiconductor chip 210 and the inner sidewall of the cavity 126.

The second semiconductor chip 210 may include a second substrate and second chip pads 216 on an active surface, that is, a first surface 212 of the first substrate. The second semiconductor chip 210 may be adhered on the first semiconductor chip 200 exposed through the cavity 126 by an adhesive film 220. The second semiconductor chip 210 may be arranged such that a backside, that is, a second surface 214 opposite to the first surface 212 on which the second chip pads 216 are formed faces toward the backside, that is, the second surface 204 of the first semiconductor chip 200. The adhesive film 220 may include, for example, a die attach film (DAF).

The first surface 212 of the second semiconductor chip 210 may be coplanar with the second surface 104 of the core substrate 100.

Then, the third molding member 140 may be formed on the second surface 104 of the core substrate 100 to cover the second semiconductor chip 210. The third molding member 140 may be formed to fill the space between the sidewall of the second semiconductor chip 210 and the inner sidewall of the cavity 126. Accordingly, the first surface 212 of the second semiconductor chip 210, the second surface 104 of the core substrate 100, and the inner sidewall of the cavity 126 of the first molding member 120 may be covered by the third molding member 140.

Thus, a first portion of the third molding member 140 may be formed on the second surface 104 of the core substrate 100, a second portion of the third molding member 140 may be formed on the inner sidewall of the cavity 126 of the first molding member 120, and a third portion of the third molding member 140 may be formed on the first surface 212 of the second semiconductor chip 210.

The third molding member 140 may include, for example, an insulation material such as epoxy resin. The third molding member 140 may include, for example, a photo imageable dielectric (PID) material. The third molding member 140 may include a material that is the same as or different from the first and second molding members 120, 130.

Referring to FIGS. 12 to 17, a first redistribution wiring 170 electrically connecting the first semiconductor chip 200 and the core connection wiring 112 of the core substrate 100 to each other may be formed on the second molding member 130, and a second redistribution wiring 180 electrically connecting the second semiconductor chip 210 and the core connection wiring 112 of the core substrate 100 to each other may be formed on the third molding member 140.

Figure 12:
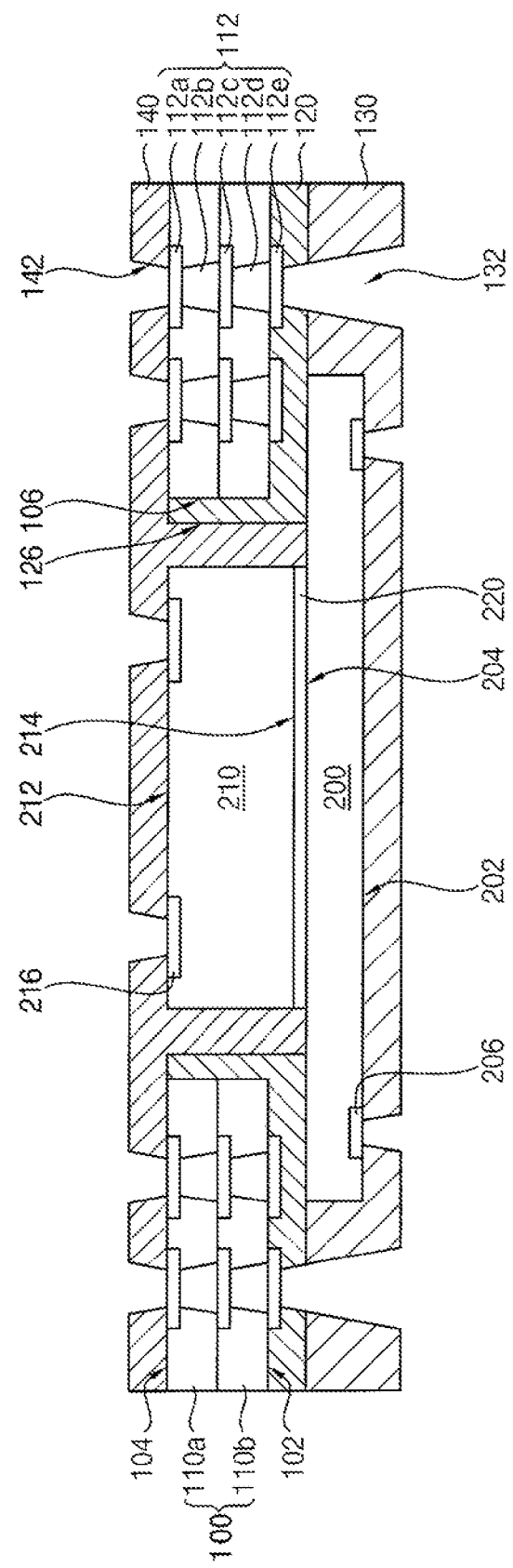

As illustrated in FIG. 12, a first photolithography process may be performed on the second molding member 130 and the first molding member 120 to form first openings 132 that expose the third metal wiring 112e of the core connection wiring 112 and the first chip pad 206 of the first semiconductor chip 200, and a second photolithography process may be performed on the third molding member 140 to form second openings 142 that expose the first metal wiring 112a of the core connection wiring 112 and the second chip pad 216 of the second semiconductor chip 210. After performing the first photolithography process, the structure in FIG. 12 may be reversed or inverted, and then, the second photolithography process may be performed.

In another implementation, a laser drilling process may be performed on the second molding member 130 and the first molding member 120 to form the first opening, and a laser drilling process may be performed on the third molding member 140 to form the second opening. The laser drilling process may be performed using, for example, UV laser light.

Figure 13:
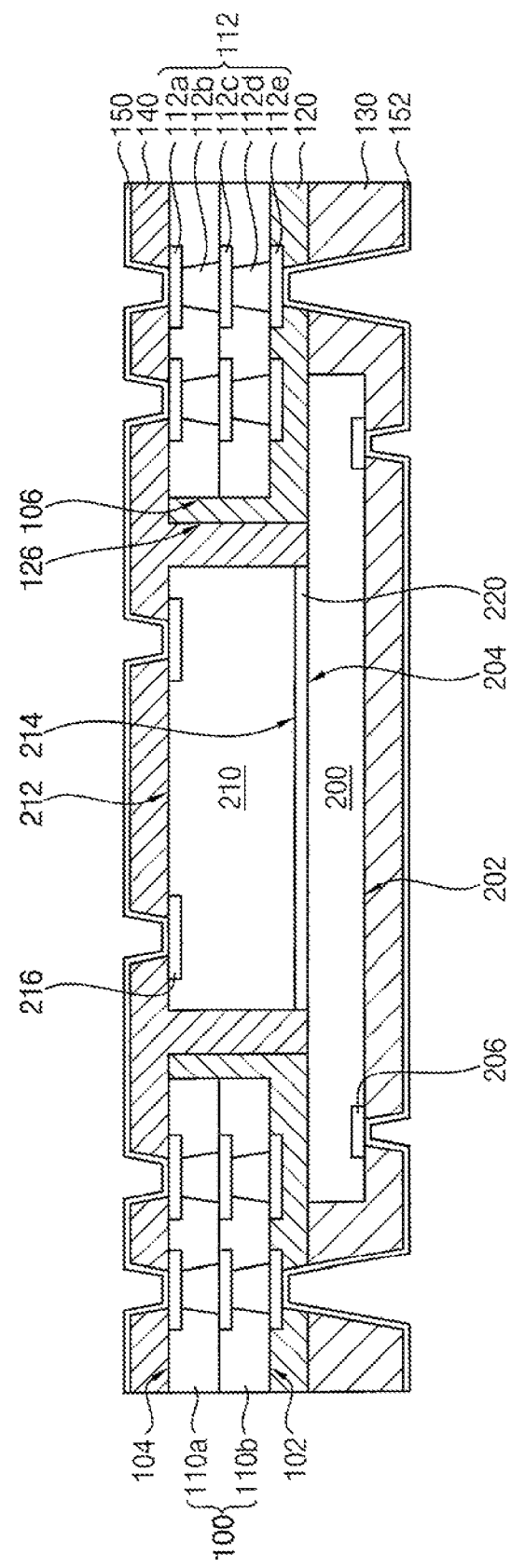

As illustrated in FIG. 13, a first seed layer 152 may be formed on the second molding member 130 and the first molding member 120 to be electrically connected to the third metal wiring 112e and the first chip pad 206 of the first semiconductor chip 200 exposed through the first openings 132, and a second seed layer 150 may be formed on the third molding member 140 to be electrically connected to the first metal wiring 112a exposed through the second openings 142.

Figure 14:
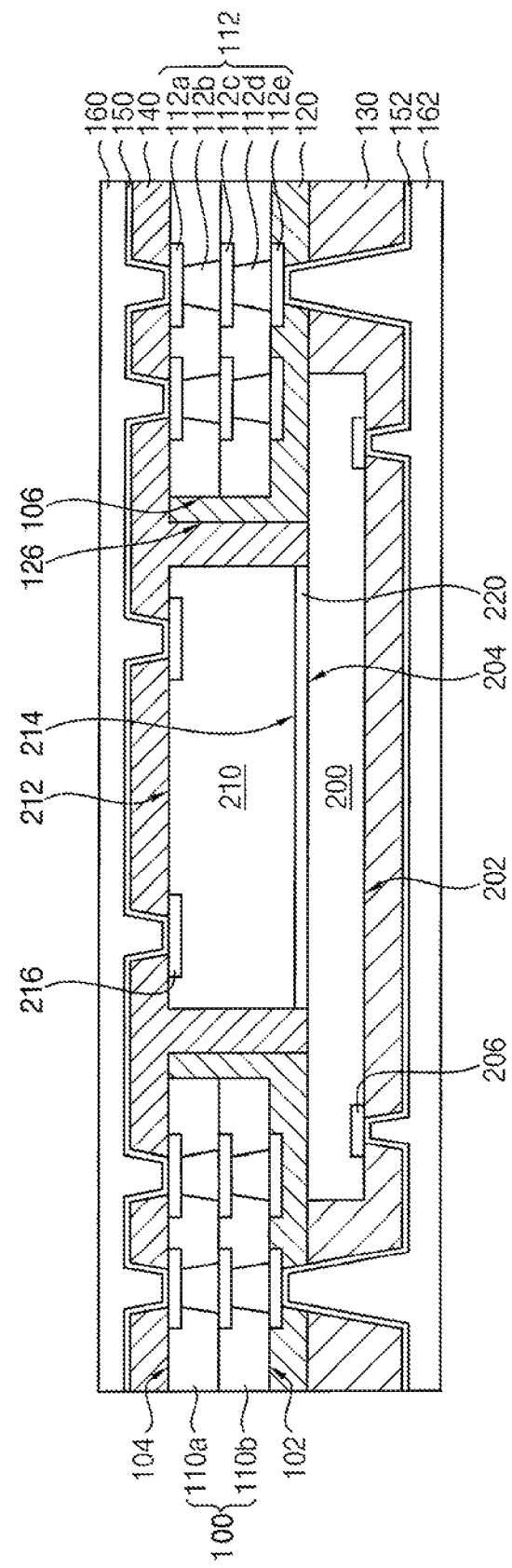
Figure 15:
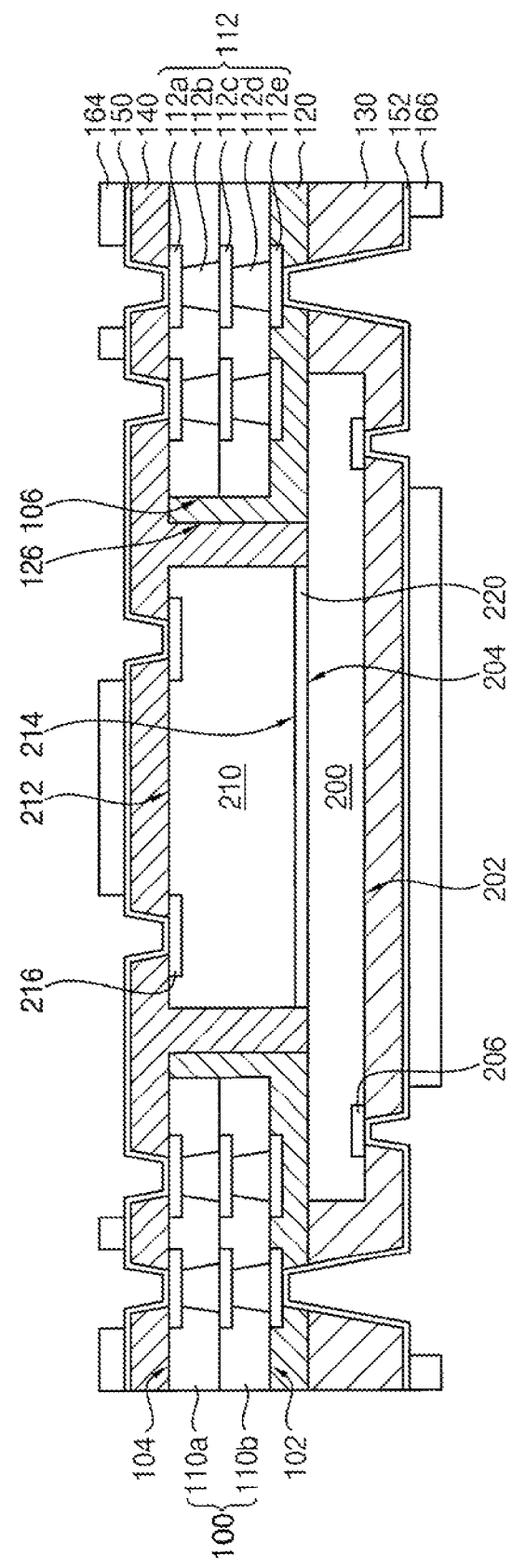

As illustrated in FIGS. 14 and 15, a first photoresist layer 162 may be formed on the first seed layer 152, a first photoresist pattern 166 may be formed to partially expose the first seed layer 152, a second photoresist layer 160 may be formed on the second seed layer 150, and then, a second photoresist pattern 164 may be formed to partially expose the second seed layer 150.

Figure 16:
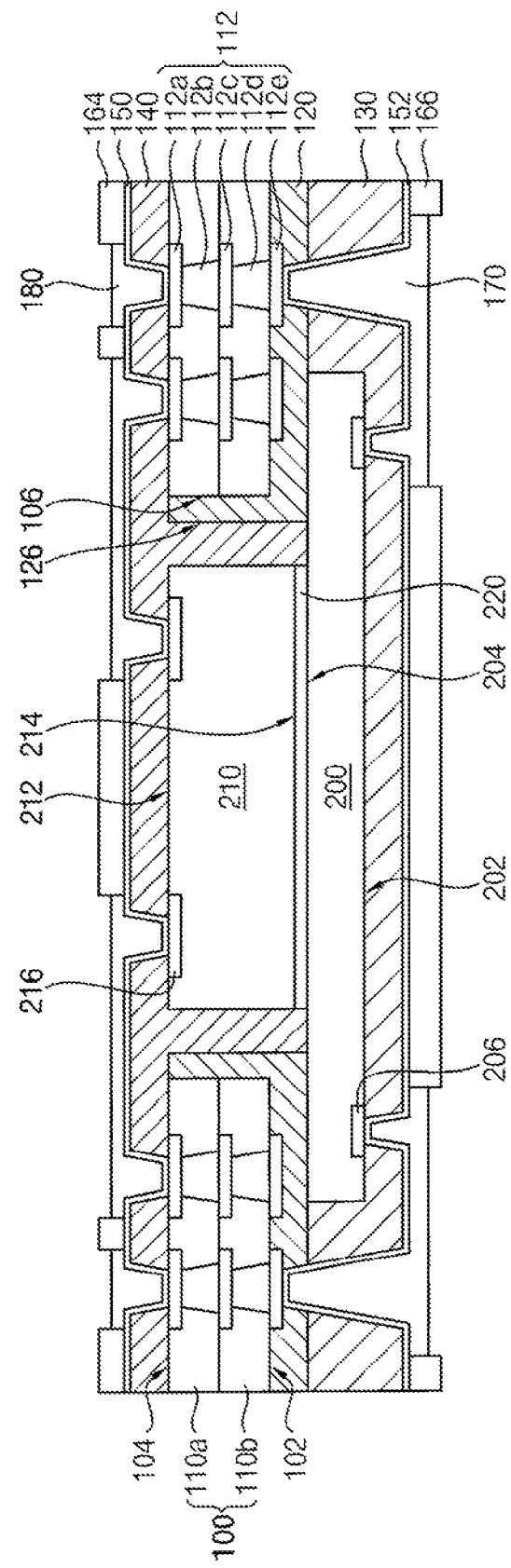

As illustrated in FIG. 16, a plating process may be performed on portions of the first seed layer 152 exposed by the first photoresist pattern 166 to form the first redistribution wiring 170, and then, a plating process may be performed on portions of the second seed layer 150 exposed by the second photoresist pattern 164 to form the second redistribution wiring 180.

Figure 17:
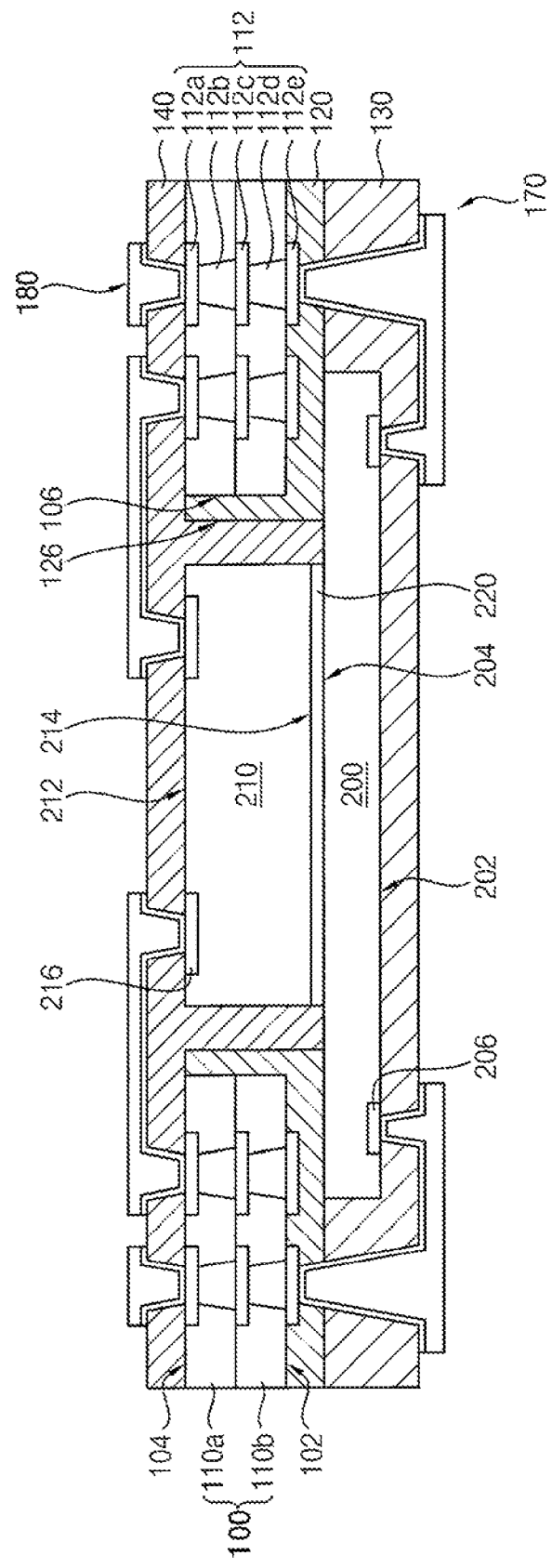

As illustrated in FIG. 17, the first photoresist pattern 166 may be removed, portions of the first seed layer 152 exposed by the first redistribution wiring 170 may be removed, the second photoresist pattern 164 may be removed, and then, portions of the second seed layer 150 exposed by the second redistribution wiring 180 may be removed. For example, the portions of the first seed layer 152 and the portions of the second seed layer 150 may be removed by a flash etching process.

Figure 18:
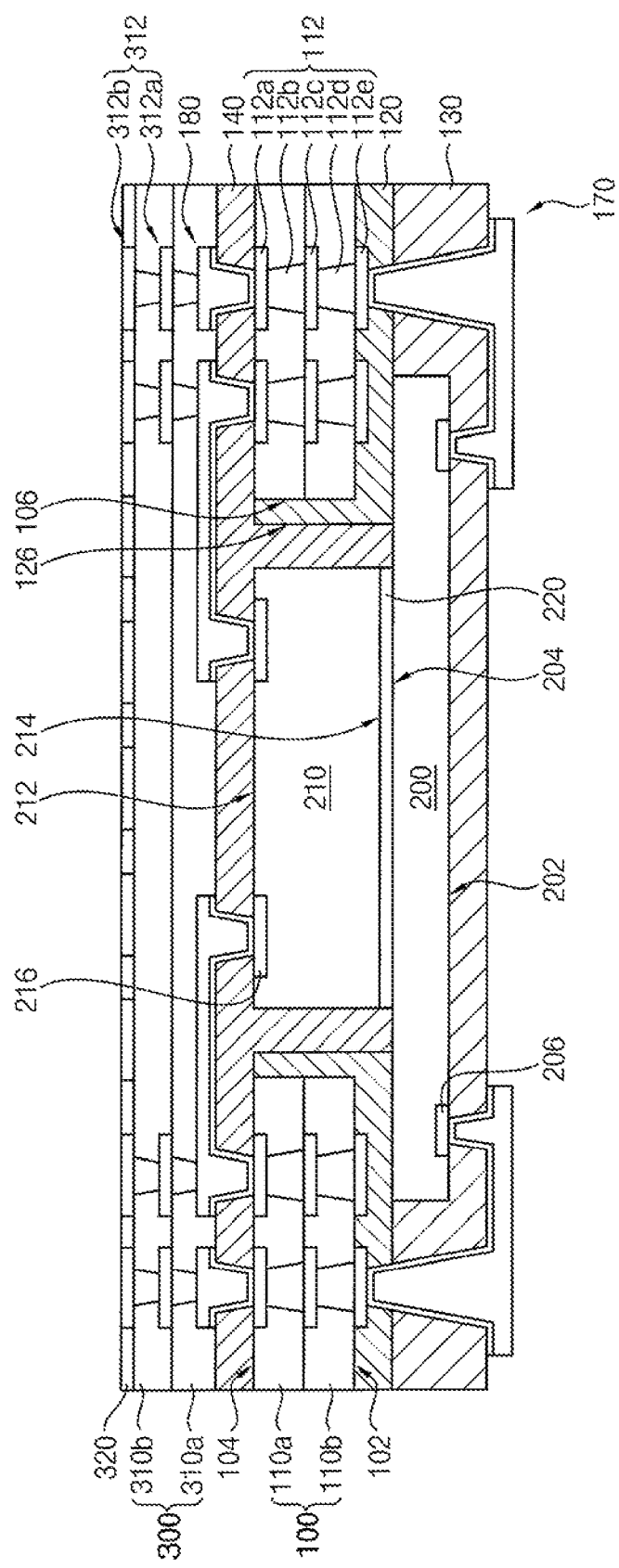

Referring to FIG. 18, a lower redistribution wiring layer 300 having lower redistribution wirings 312 electrically connected to the second redistribution wirings 180 may be formed on the third molding member 140.

For example, after a first lower insulation layer 310a is formed on the third molding member 140 to cover the second redistribution wirings 180, the first lower insulation layer 310a may be patterned to form third openings which expose the second redistribution wirings 180, respectively. The first lower insulation layer 310a may include, for example, a polymer layer, a dielectric layer, etc. The first lower insulation layer 310a may be formed by a vapor deposition process, a spin coating process, etc.

First lower redistribution wirings 312a may be formed on the first lower insulation layer 310a to make contact with the second redistribution wirings 180 through the third openings, respectively. The first lower redistribution wiring 312a may be formed on a portion of the first lower insulation layer 310a and a portion of the second redistribution wiring 180. The first lower redistribution wiring may be formed by forming a seed layer on the portion of the first lower insulation layer 310a and in the third opening, patterning the seed layer and performing an electro plating process. Accordingly, at least a portion of the first lower redistribution wiring 312a may make contact with the second redistribution wiring 180 through the third opening.

The first lower redistribution wiring may include, for example, aluminum (Al), copper (Cu), tin (Sn), nickel (Ni), gold (Au), platinum (Pt), or an alloy thereof.

Similarly, after a second lower insulation layer 310b is formed on the first lower insulation layer 310a to cover the first lower redistribution wirings 312a, the second lower insulation layer 310b may be patterned to form fourth openings which expose the first lower redistribution wirings 312a, respectively.

Second lower redistribution wirings 312b may be formed on the second lower insulation layer 310b to make contact with the first lower redistribution wirings 312a through the fourth openings, respectively. The second lower redistribution wiring 312b may be formed on a portion of the second lower insulation layer 310b and a portion of the first lower redistribution wiring 312a. The second lower redistribution wiring may be formed by forming a seed layer on the portion of the second lower insulation layer 310b and in the fourth opening, patterning the seed layer and performing an electro plating process. Accordingly, at least a portion of the second lower redistribution wiring 312b may make contact with the first lower redistribution wiring 312a through the fourth opening.

A protective layer 320 may be formed on the second lower insulation layer 310b to expose at least a portion of the second lower redistribution wiring 312b. In an example embodiment, the portion of the second lower redistribution wiring 312b may function as a landing pad, that is, a package pad.

Thus, the lower redistribution wiring layer 300 having the lower redistribution wirings 312 electrically connected to the respective second redistribution wirings may be formed on the third molding member 140 on the second surface 104 of the core substrate 100. It may be understood that the number, sizes, arrangements, etc. of the lower insulation layers of the lower redistribution wiring layer are illustrated as examples and may be varied.

Then, outer connection members 400 (see FIG. 1) may be formed on an outer surface of the lower redistribution wiring layer 300 to be electrically connected to the lower redistribution wirings 312. For example, a solder ball as the outer connection member may be disposed on the portion of the second lower redistribution wiring 132b, that is, the package pad. Thus, the outer connection members 400 may be formed on the lower redistribution wiring layer 300 having fan-out type solder ball landing pads.

Then, a sawing process may be performed on the core substrate 100 to form an individual fan-out panel level package including the first and second semiconductor chips 200, 210 stacked therein and the outer connection members, some of which are arranged in a fan-out region to be electrically connected to the first and second semiconductor chips 200, 210.

Figure 19:
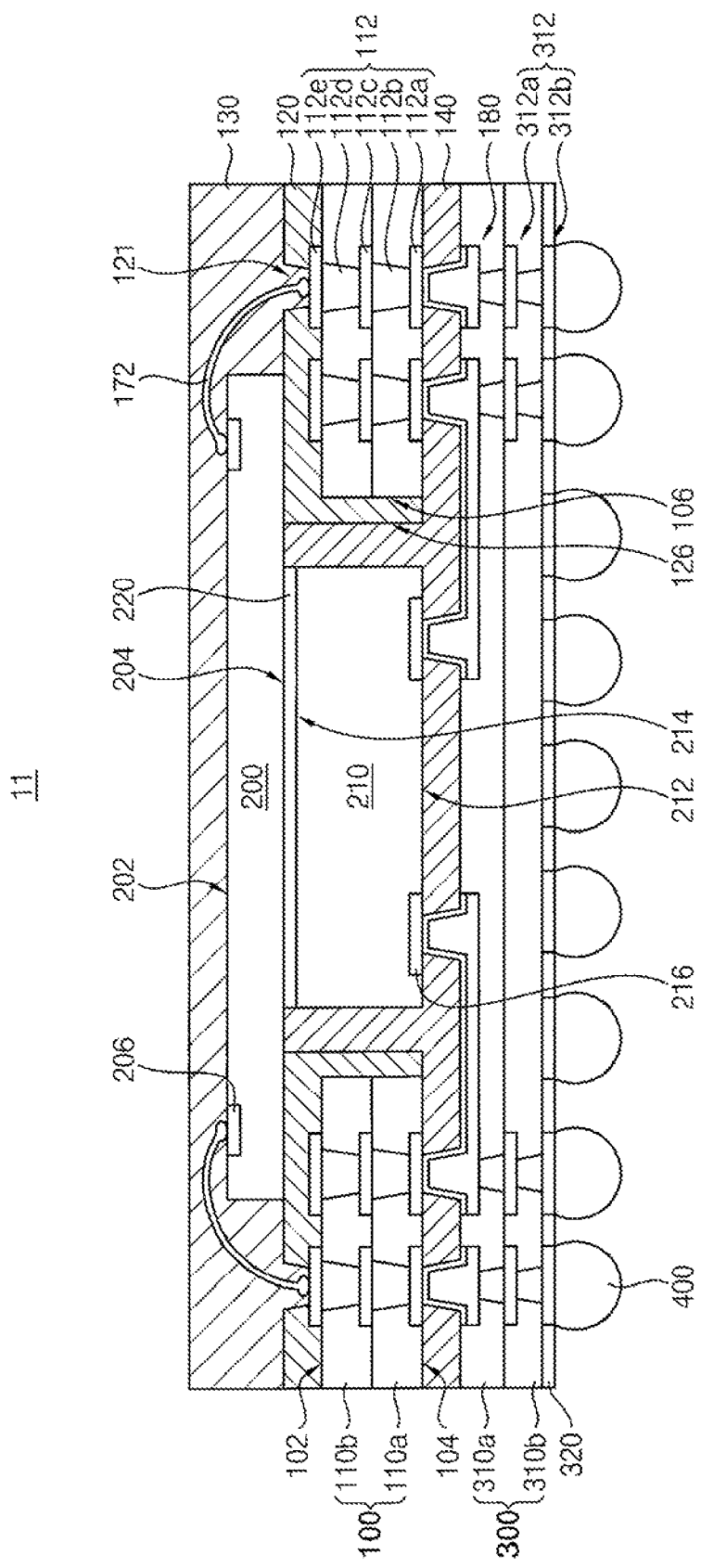
FIG. 19 is a cross-sectional view illustrating a semiconductor package in accordance with an example embodiment.

FIG. 19 is a cross-sectional view illustrating a semiconductor package in accordance with an example embodiment. The semiconductor package may be substantially the same as or similar to the semiconductor package described with reference to FIG. 1 except for configurations of a second molding member and first redistribution wirings. Thus, same reference numerals will be used to refer to the same or like elements and any further repetitive explanation concerning the above elements will be omitted.

Referring to FIG. 19, a first semiconductor chip 200 of a semiconductor package 11 may be electrically connected to core connection wirings 112 of a core substrate 100 by first redistribution wirings 172. In an example embodiment, the first redistribution wirings 172 may include bonding wires.

In an example embodiment, a first end portion of the bonding wire may be bonded to the core connection wiring 112 through an opening 121 in a second molding member 120, and a second end portion of the bonding wire may be bonded to first chip pad 206 of a first semiconductor chip 200.

A second molding member 130 may include a first portion and a second portion. The bonding wire may be disposed on the first portion of the second molding member 130 and electrically connect the first chip pad 206 and the core connection wiring 112. The second portion of the second molding member 130 may be arranged on the first portion to cover the bonding wire. The first portion and the second portion may be formed integrally each other to completely cover the first semiconductor chip 200 on the first molding member 120.

Hereinafter, a method of manufacturing the semiconductor package in FIG. 19 will be described.

FIGS. 20 to 26 are cross-sectional views illustrating stages in a method of manufacturing a semiconductor package in accordance with an example embodiment.

Figure 20:
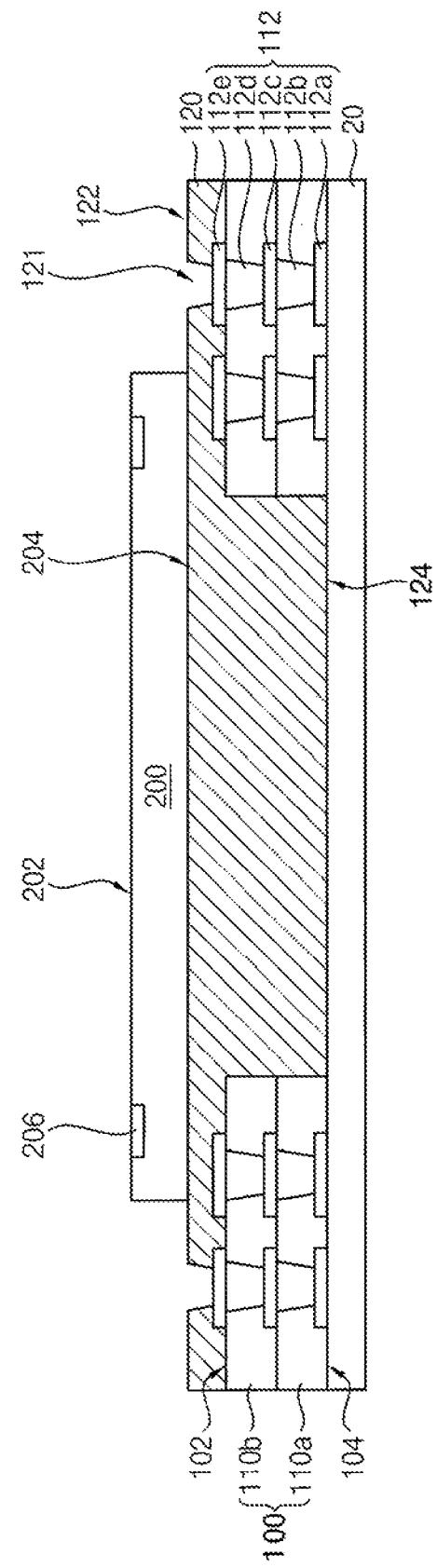
FIGS. 20 to 26 are cross-sectional views illustrating stages in a method of manufacturing a semiconductor package in accordance with an example embodiment.

Referring to FIG. 20, first, processes the same as or similar to the processes described with reference to FIGS. 4 to 6 may be performed to adhere a first semiconductor chip 200 on a first molding member 120 on a first surface 102 of a core substrate 100. Then, first openings 121 may be formed in the first molding member 120 to expose at least a portion of a core connection wiring 112. In an example embodiment, a photolithography process may be performed on the first molding member 120 to form the first openings 121 that expose third metal wirings 112e of the core connection wiring 112. In another implementation, a drilling process may be performed on the first molding member 120 to form the first openings. The laser drilling process may be performed using, for example, UV laser light.

Figure 21:
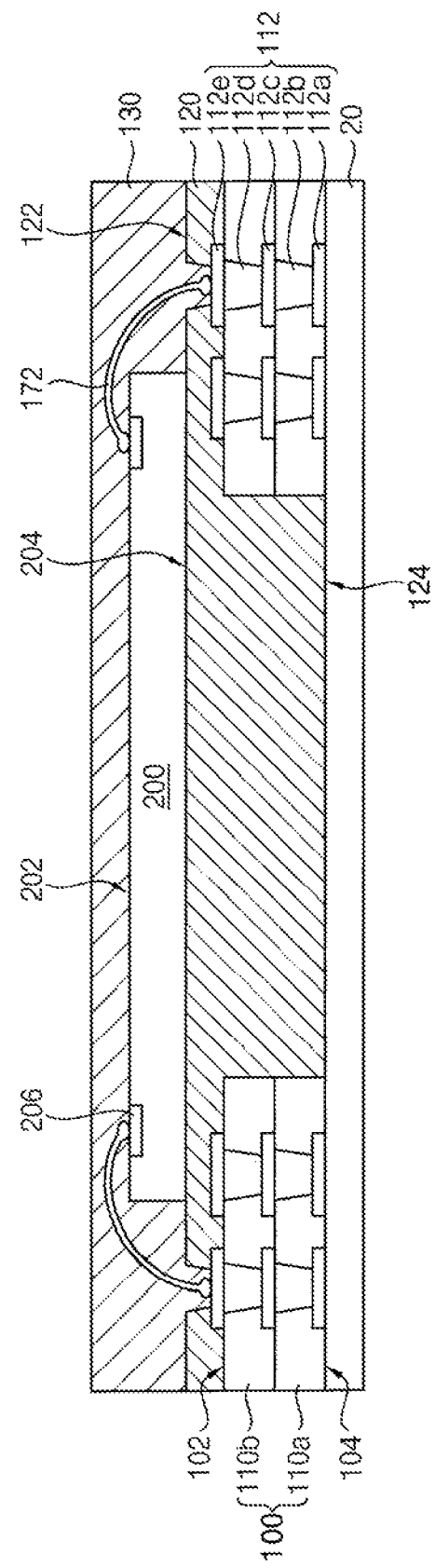

Referring to FIG. 21, first redistribution wirings 172 may be formed to electrically connect first chip pads 206 of the first semiconductor chip 200 and the core connection wirings 112. In an example embodiment, a wire bonding process may be performed to form bonding wires that electrically connect the first chip pads 206 of the first semiconductor chip 200 and the core connection wiring 112, and the bonding wires may be provided as the first redistribution wirings 172.

Next, a second molding member 130 may be formed on the first molding member 120 on the first surface 102 of the core substrate 100 to cover the first semiconductor chip 200. The second molding member 130 may be formed on a first surface 122 of the first molding member 120 on the first surface 102 of the core substrate 100 to cover the first semiconductor chip 200. Thus, the first redistribution wirings 172 may be arranged on a first portion of the second molding member 130, and a second portion of the second molding member 130 may be provided on the first portion of the second molding member 130 to cover the first redistribution wirings 172.

Figure 22:
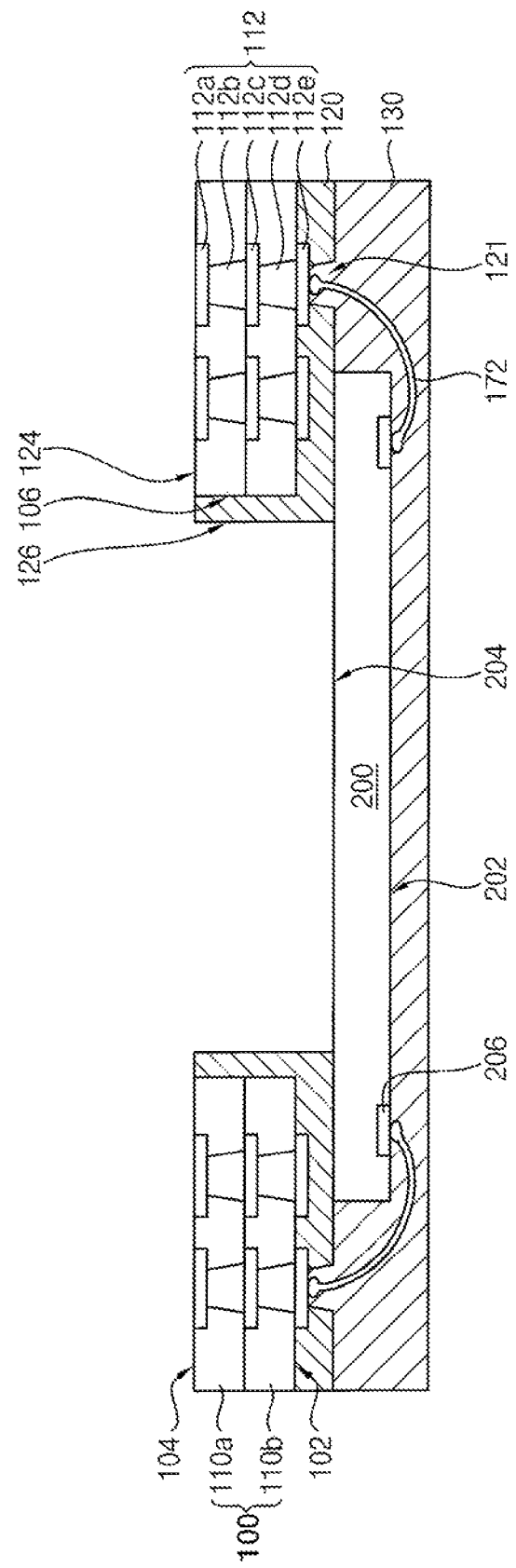

Referring to FIG. 22, the structure in FIG. 21 may be reversed or inverted. Then, a cavity 126 may be formed in the first molding member 120. For example, by removing a barrier tape 20, a second surface 124 of the first molding member 120 may be exposed through a through hole 106 of the core substrate 100. A laser ablation process may be performed on the second surface 124 of the first molding member 120 exposed through the through hole 106 to form the cavity 126 in the first molding member 120.

The cavity 126 may be formed to extend in a thickness direction from the second surface 124 of the first molding member 120. The cavity 126 may extend from the second surface 124 to the first surface 122 of the first molding member 120 to expose a second surface 204 of the first semiconductor chip 200.

An inner sidewall of the cavity 126 may be spaced apart from an inner sidewall of the through hole 106 of the core substrate 100. Accordingly, a first portion of the first molding member 120 may be formed on the first surface 102 of the core substrate 100, and a second portion of the first molding member 120 may be formed on the inner sidewall of the through hole 106 of the core substrate 100.

Figure 23:
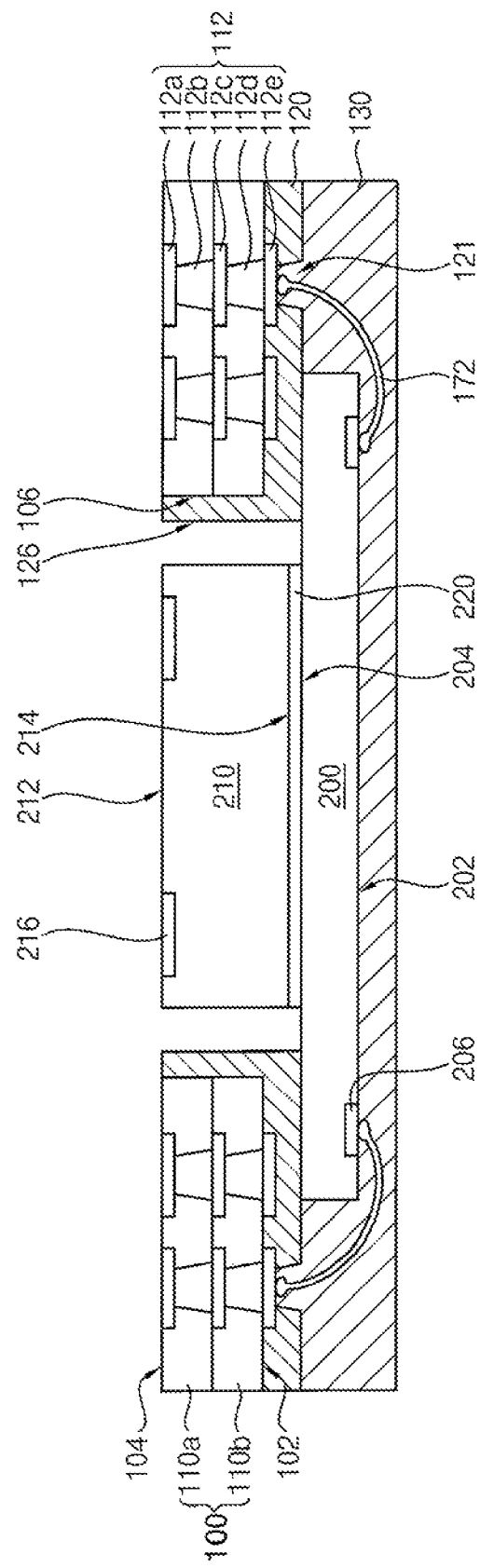
Figure 24:
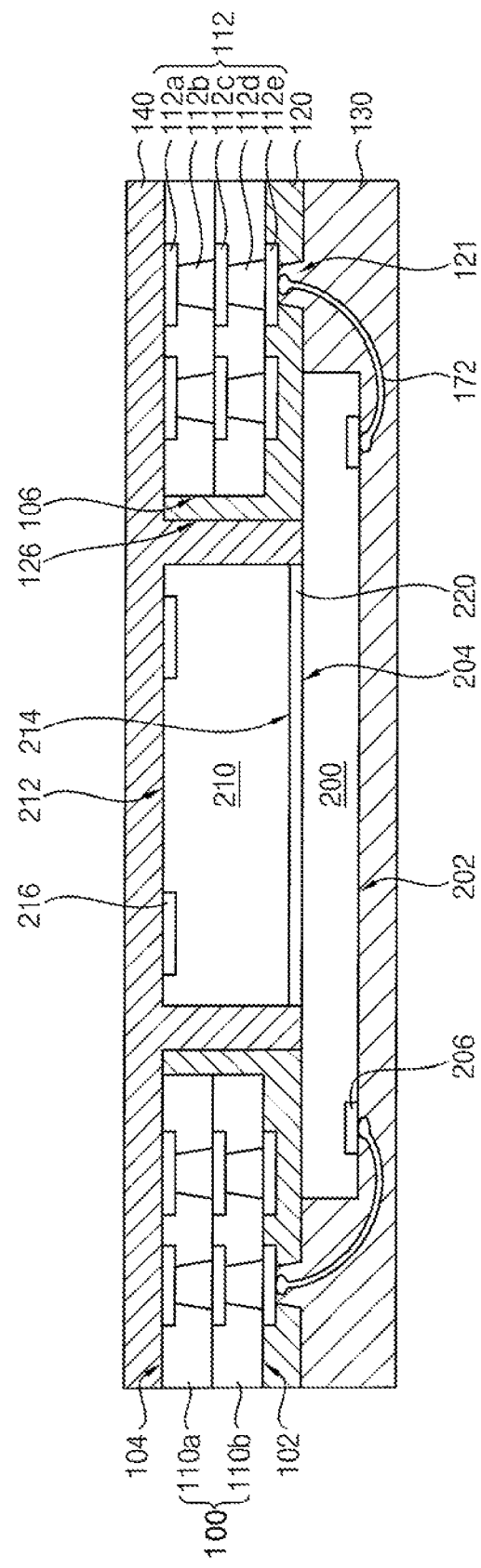

Referring to FIGS. 23 and 24, processes the same as or similar to the processes described with reference to FIGS. 10 and 11 may be performed so that a second semiconductor chip 210 may be arranged within the cavity 126 of the first molding member 120, and then, a third molding member 140 may be formed on a second surface 104 of the core substrate 100 to cover the second semiconductor chip 210.

Figure 25:
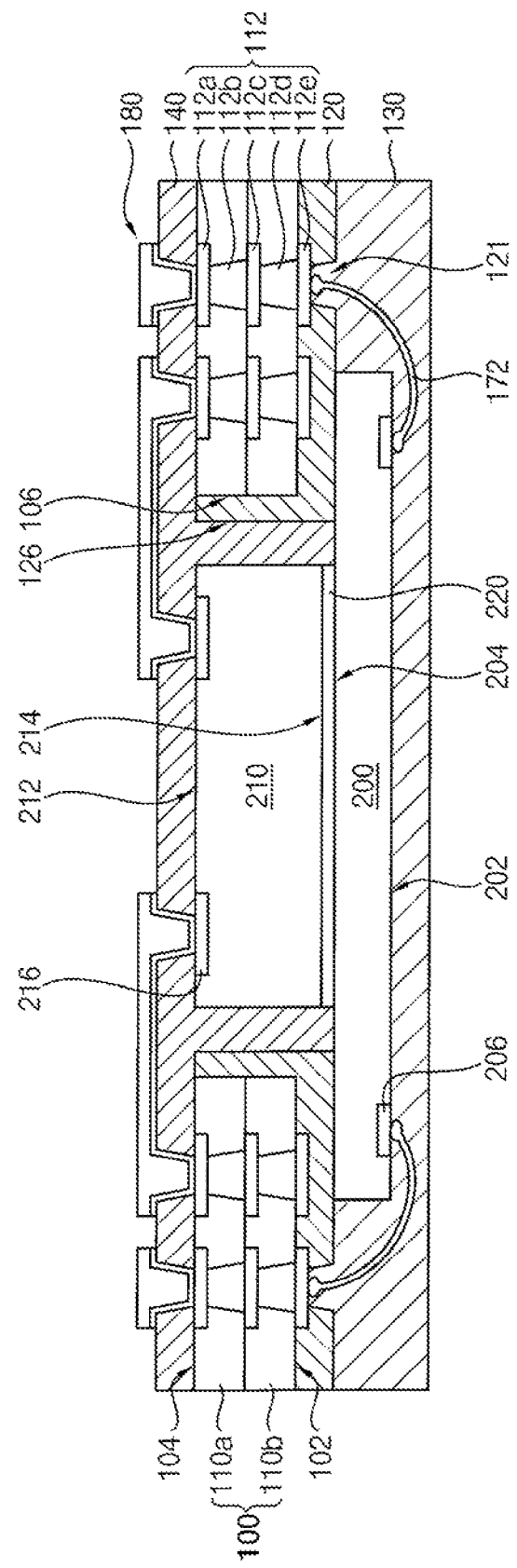

Referring to FIG. 25, second redistribution wirings 180 electrically connecting the second semiconductor chip 210 and the core connection wirings 112 of the core substrate 100 to each other may be formed on the third molding member 140. For example, a photolithography process may be performed on the third molding member 140 to form second openings that expose first metal wirings 112a of the core connection wiring 112. Then, the second redistribution wirings 180 may be formed on the third molding member 140 to be electrically connected to the first metal wirings 112a exposed through the openings.

Figure 26:
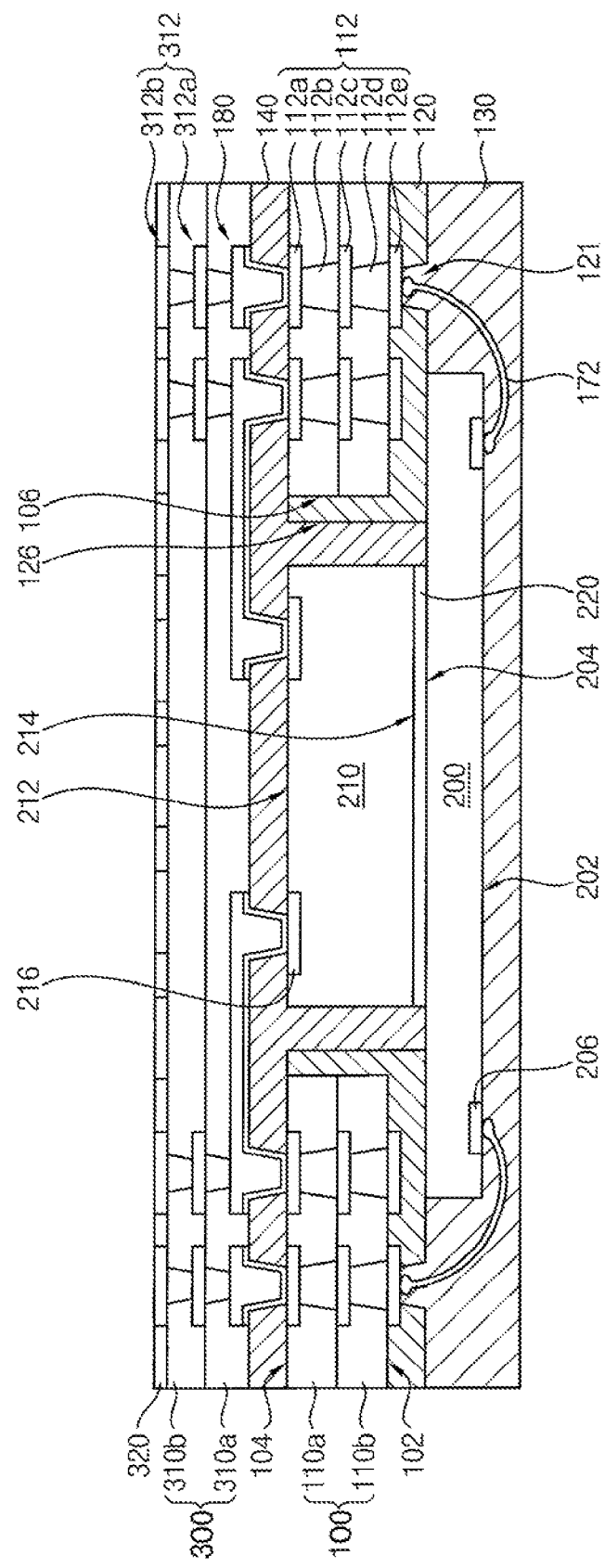

Referring to FIG. 26, processes the same as or similar to the processes described with reference to FIGS. 10 and 11 may be performed to form a lower redistribution wiring layer 300 having lower redistribution wirings 312 electrically connected to the second redistribution wirings 180 on the third molding member 140.

Then, outer connection members 400 (see FIG. 19) may be formed on an outer surface of the lower redistribution wiring layer 300 to be electrically connected to the lower redistribution wirings 312.

Then, a sawing process may be performed on the core substrate 100 to form an individual fan-out panel level package including the first and second semiconductor chips 200, 210 stacked therein and the outer connection members, some of the outer connection members being arranged in a fan-out region to be electrically connected to the first and second semiconductor chips 200, 210.

Figure 27:
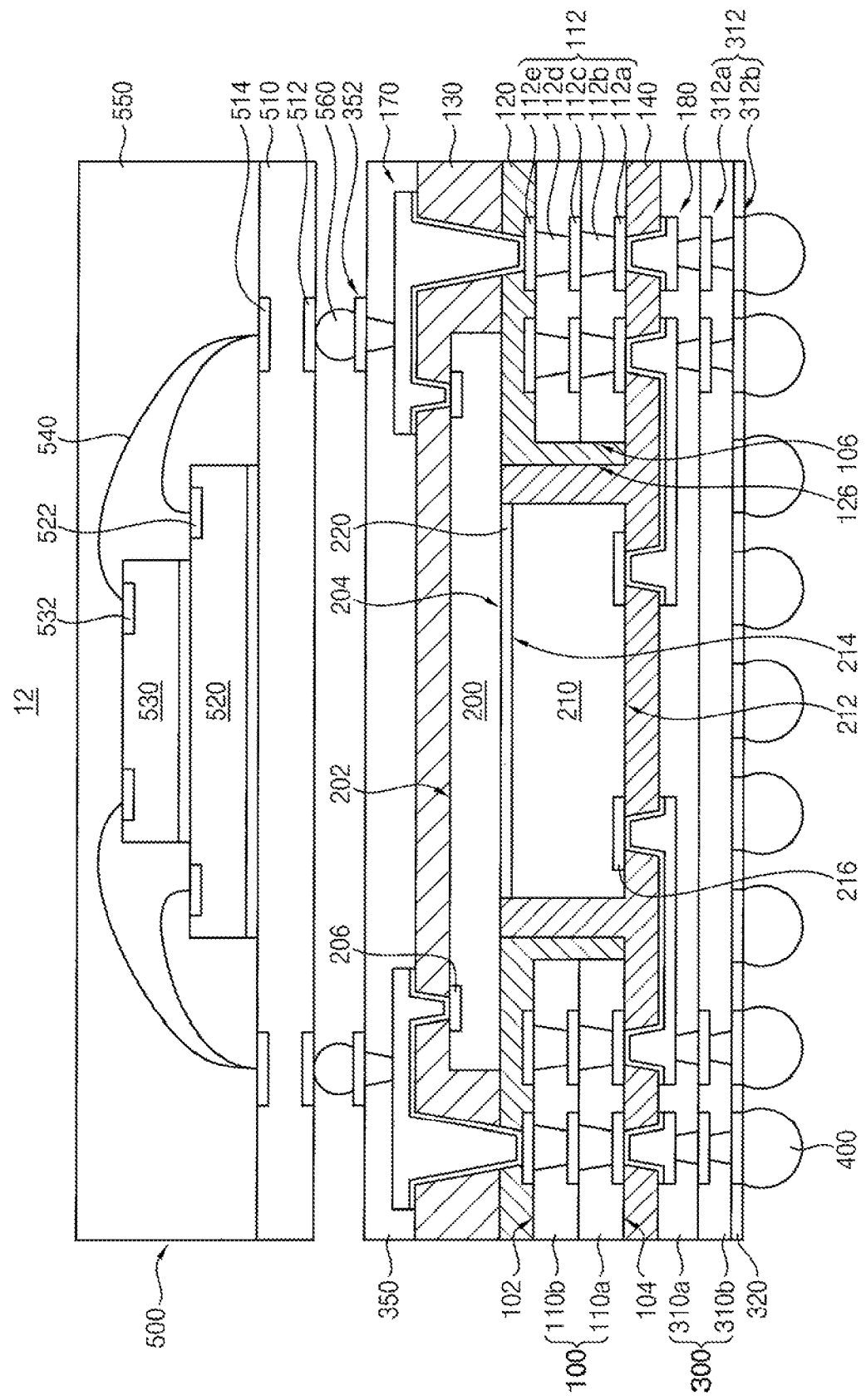
FIG. 27 is a cross-sectional view illustrating a semiconductor package in accordance with an example embodiment.

FIG. 27 is a cross-sectional view illustrating a semiconductor package in accordance with an example embodiment. The semiconductor package may be substantially the same as or similar to the semiconductor package described with reference to FIG. 1 except for an upper redistribution wiring layer and an additional second package. Thus, same reference numerals will be used to refer to the same or like elements and further repetitive explanation concerning the above elements may be omitted.

Referring to FIG. 27, a semiconductor package 12 may include a first package and a second package 500 stacked on the first package. The first package may include a core substrate 100, first to third molding member 120, 130, 140, first and second semiconductor chips 200, 210, first redistribution wirings 170, second redistribution wirings 180, a lower redistribution wiring layer 300 and an upper redistribution wiring layer.

In an example embodiment, the upper redistribution wiring layer may be arranged on the second molding member 130 and may include upper redistribution wirings 352 electrically connected to the first redistribution wirings 170, respectively.

The upper redistribution wiring layer may include an upper insulation layer 350 formed on the second molding member 130 and having openings that expose the first redistribution wirings 170 and the upper redistribution wirings 352 in direct contact with the first redistribution wirings 170 through the openings.

It may be understood that the number, sizes, arrangements, etc. of the upper insulation layer(s) and the upper redistribution wiring(s) of the upper redistribution wiring layer are illustrated as examples and may be varied.

The second package 500 may include a second package substrate 510, third and fourth semiconductor chips 520, 530 mounted on the second package substrate 510, and a molding member 550 on the second package substrate 510 to cover the third and fourth semiconductor chips 520, 530.

The second package 500 may be stacked on the first package via conductive connection members 560. For example, the conductive connection members 560 may include solder balls, conductive bumps, etc. The conductive connection member 560 may be arranged between the upper redistribution wiring 352 and a first bonding pad 512 of the second package substrate 510. Accordingly, the first package and the second package 500 may be electrically connected to each other by the conductive connection members 560.

The third and fourth semiconductor chips 520, 530 may be stacked on the second package substrate 510 by adhesive members. Bonding wires 540 may electrically connect chip pads 52, 532 of the third and fourth semiconductor chips 520, 530 to second bonding pads 514 of the second package substrate 510. The third and fourth semiconductor chips 520, 530 may be electrically connected to the second package substrate 510 by bonding wires 540.

Although the second package 500 including two semiconductor chips mounted in a wire bonding manner are illustrated in the figure, it may be understood that the number, the mounting manner, etc. of the semiconductor chips of the second package may be varied.

Hereinafter, a method of manufacturing the semiconductor package in FIG. 27 will be described.

Figure 28:
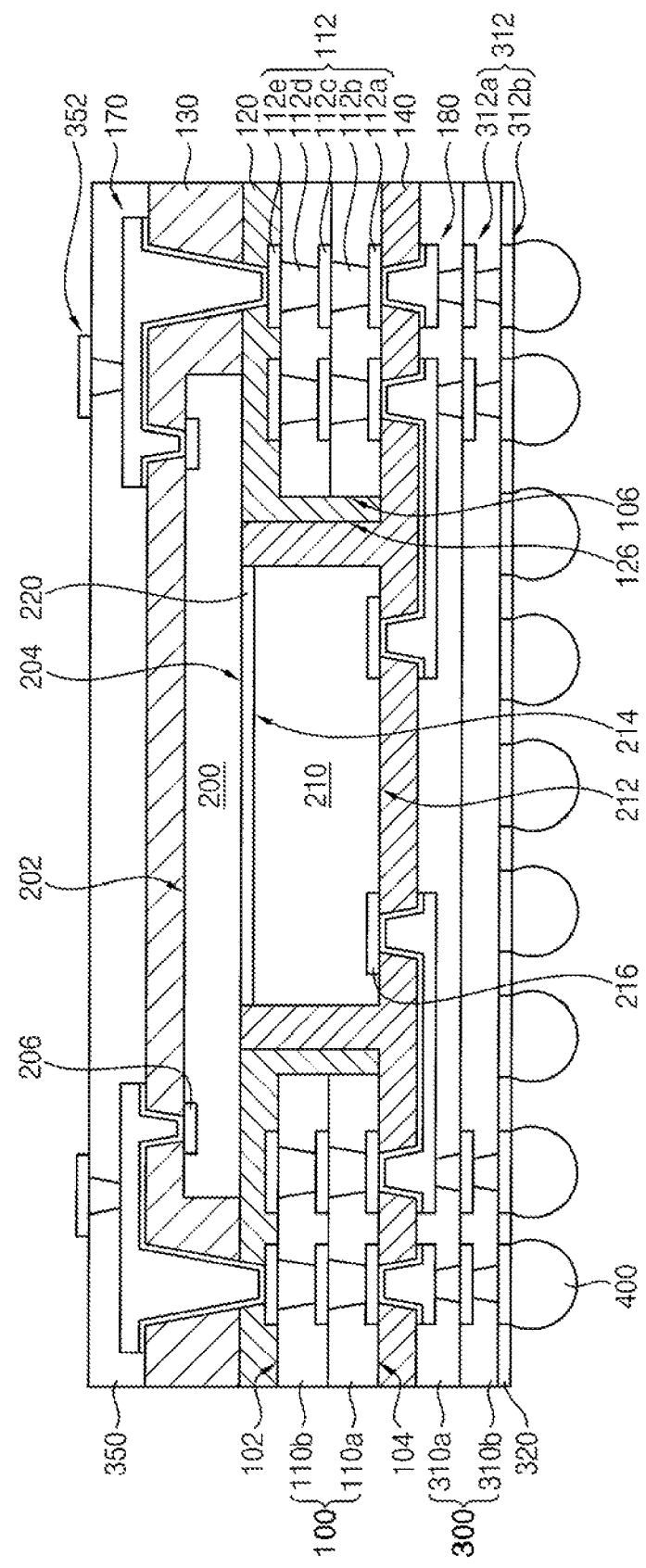
FIGS. 28 and 29 are cross-sectional views illustrating stages in a method of manufacturing a semiconductor package in accordance with an example embodiment.
Figure 29:
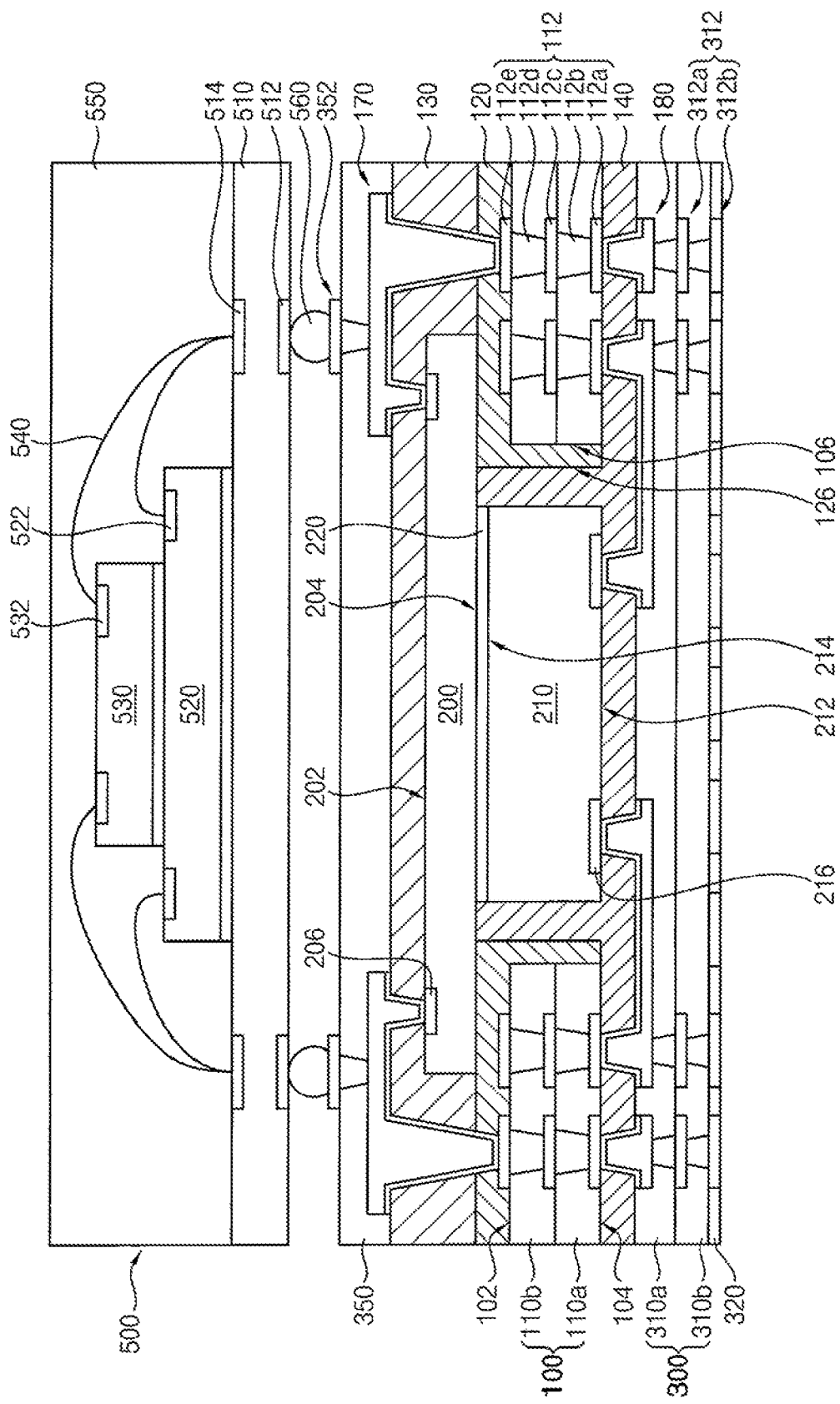

FIGS. 28 and 29 are cross-sectional views illustrating stages in a method of manufacturing a semiconductor package in accordance with an example embodiment.

Referring to FIG. 28, first, processes the same as or similar to the processes described with reference to FIGS. 4 to 18 may be performed to form a lower redistribution wiring layer 300 having lower redistribution wirings 312 electrically connected to second redistribution wirings 180 on a third molding member 140, and then, an upper redistribution wiring layer having upper redistribution wirings 352 electrically connected to first redistribution wirings 170 on a second molding member 130.

For example, an upper insulation layer 350 may be formed on the second molding member 130 to cover the first redistribution wirings 170, and then, the upper insulation layer 350 may be patterned to form openings which the first redistribution wirings 170, respectively. The upper insulation layer 350 may include, for example, a polymer layer, a dielectric layer, etc. The upper insulation layer may be formed by a vapor deposition process, a spin coating process, etc.

Upper redistribution wirings 352 may be formed on the upper insulation layer 350 to make contact with the first redistribution wirings 170, respectively. The upper redistribution wiring 352 may be formed on a portion of the upper insulation layer 350 and a portion of the first redistribution wirings 170. The upper redistribution wiring may be formed by forming a seed layer on the portion of the upper insulation layer 350 and in the opening, patterning the seed layer and performing an electro plating process. Accordingly, at least a portion of the upper redistribution wiring 352 may make contact with the first redistribution wirings 170 through the opening. For example, the upper redistribution wiring may include, for example, aluminum (Al), copper (Cu), tin (Sn), nickel (Ni), gold (Au), platinum (Pt), or an alloy thereof.

It may be understood that the number, sizes, arrangements, etc. of the upper insulation layer(s) of the upper redistribution wiring layer are illustrated as examples and may be varied.

Then, a sawing process may be performed on the core substrate 100 to form a first package including the first and second semiconductor chips 200, 210.

Referring to FIG. 29, a second package 500 may be stacked on the first package.

In an example embodiment, the second package 500 may include a second package substrate 510, third and fourth semiconductor chips 520, 530 mounted on the second package substrate 510, and a molding member 550 on the second package substrate 510 to cover the third and fourth semiconductor chips 520, 530.

The second package 500 may be stacked on the first package via conductive connection members 560. For example, the conductive connection members 560 may include solder balls, conductive bumps, etc. The conductive connection member 560 may be arranged between the upper redistribution wiring 352 of the upper redistribution wiring layer and a first bonding pad 512 of the second package substrate 510. Accordingly, the first package and the second package 500 may be electrically connected to each other by the conductive connection members 560.

The third and fourth semiconductor chips 520, 530 may be stacked on the second package substrate 510 by adhesive members. Bonding wires 540 may electrically connect chip pads 52, 532 of the third and fourth semiconductor chips 520, 530 to second bonding pads 514 of the second package substrate 510. The third and fourth semiconductor chips 520, 530 may be electrically connected to the second package substrate 510 by bonding wires 540.

Figure 30:
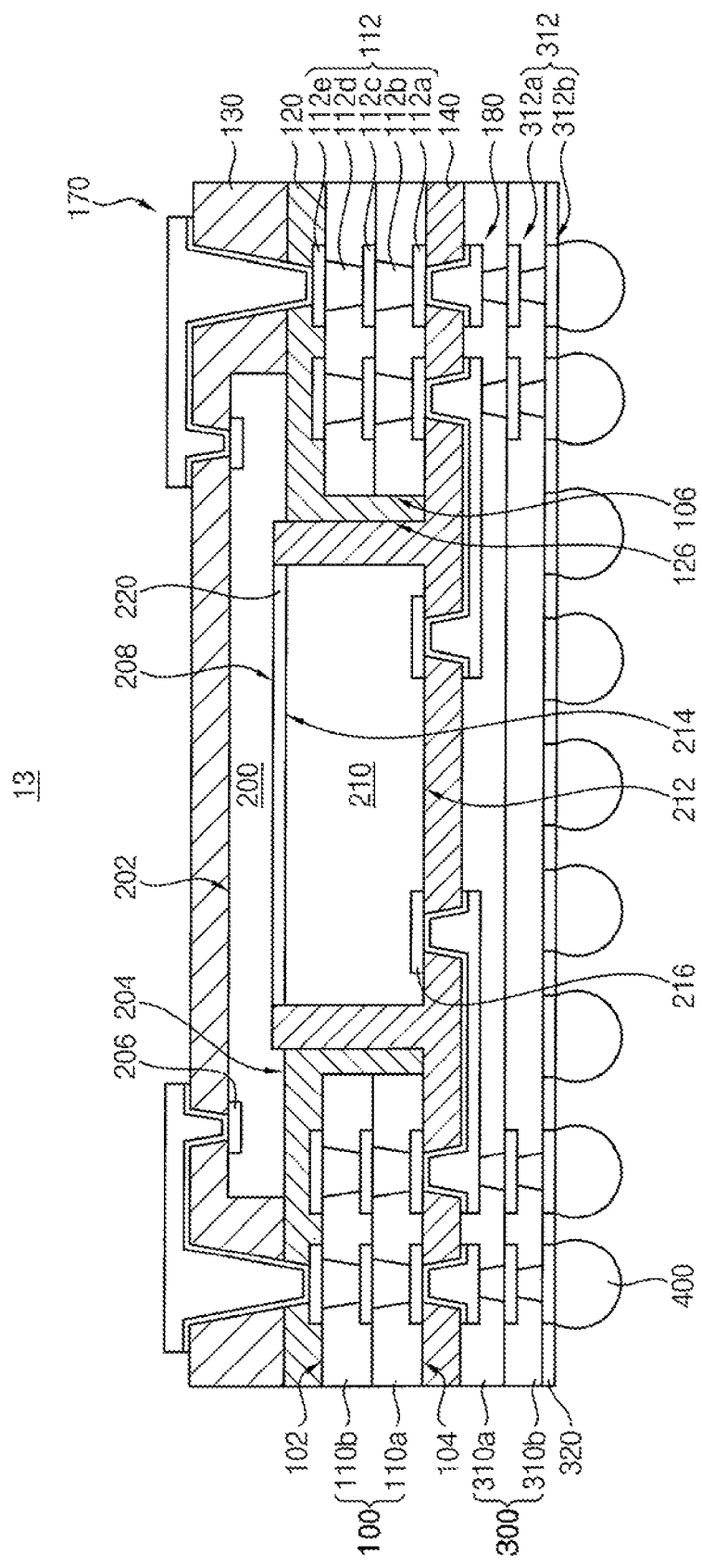
FIG. 30 is a cross-sectional view illustrating a semiconductor package in accordance with an example embodiment.

FIG. 30 is a cross-sectional view illustrating a semiconductor package in accordance with an example embodiment. The semiconductor package may be substantially the same as or similar to the semiconductor package described with reference to FIG. 1 except for configurations of first and second semiconductor chips. Thus, same reference numerals will be used to refer to the same or like elements and further repetitive explanation concerning the above elements may be omitted.

Referring to FIG. 30, a recess 208 may be provided in a second surface 204 of a first semiconductor chip 200. The recess 208 may be connected to a cavity 126 of a third molding member 140.

A second semiconductor chip 210 may be arranged on the recess 208 of the first semiconductor chip 200. The second semiconductor chip 210 may be adhered on a bottom surface of the recess 208 of the first semiconductor chip 200 exposed through the cavity 126 by an adhesive film. A depth of the recess 208 may be determined in consideration of a thickness of the adhesive film 220.

Hereinafter, a method of manufacturing the semiconductor package in FIG. 30 will be described.

Figure 31:
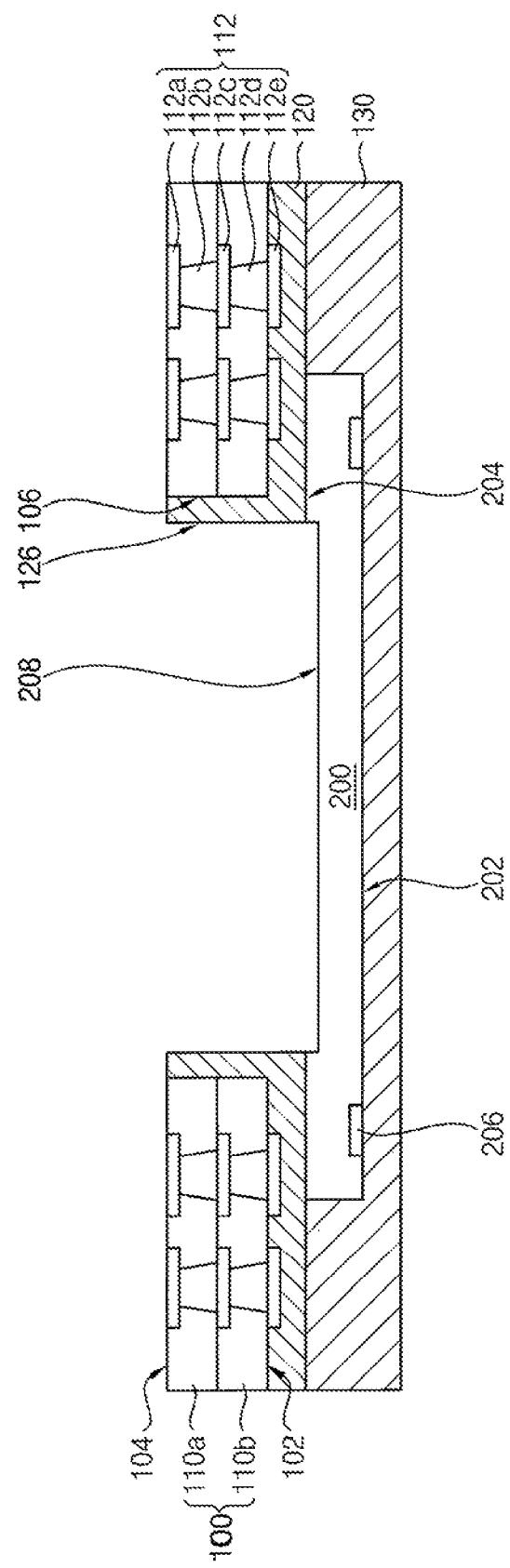
FIGS. 31 and 32 are cross-sectional views illustrating stages in a method of manufacturing a semiconductor package in accordance with an example embodiment.
Figure 32:
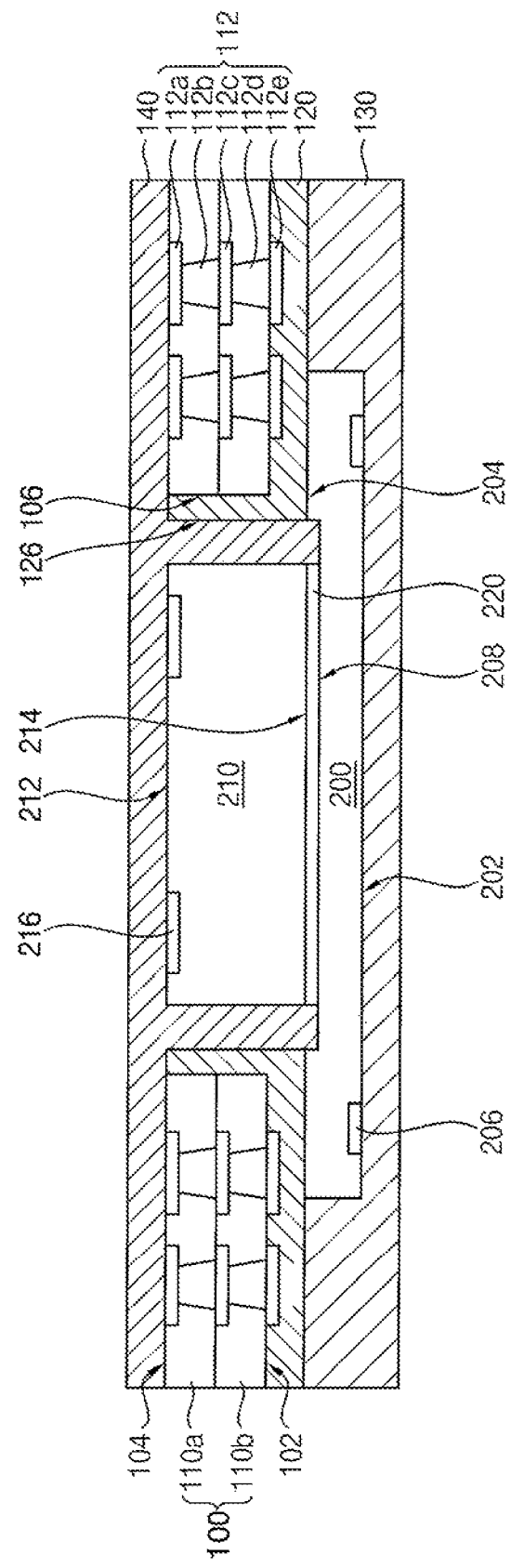

FIGS. 31 and 32 are cross-sectional views illustrating stages in a method of manufacturing a semiconductor package in accordance with an example embodiment.

Referring to FIG. 31, first, processes the same as or similar to the processes described with reference to FIGS. 4 to 9 may be performed to form a cavity 126 in a first molding member 120, and a second surface 204 of a first semiconductor chip 200 may be partially removed. For example, a laser ablation process may be performed on a second surface 124 of the first molding member 120 exposed through a through hole 106 to form the cavity 126 in the first molding member 120. The laser ablation process may be performed until the second surface 204 of the first semiconductor chip 200 is partially removed. Thus, the cavity 126 may be formed to penetrate through the first molding member 120, and a recess 208 may be formed in the second surface 204 of the first semiconductor chip 200 to be connected to the cavity 126. A depth of the recess 208 may be determined in consideration of a thickness of an adhesive film, as described below.

Referring to FIG. 32, a second semiconductor chip 210 may be arranged within the cavity 126 of the first molding member 120, and then, a third molding member 140 may be formed on a second surface 104 of the core substrate 100 to cover the second semiconductor chip 210. For example, the second semiconductor chip 210 may be arranged on the recess 208 of the first semiconductor chip 200, and the second semiconductor chip 210 may be adhered on a bottom surface of the recess 208 of the first semiconductor chip 200 exposed through the cavity 126 by an adhesive film 220. The depth of the recess 208 may be, for example, the same as the thickness of the adhesive film 220.

Figure 33:
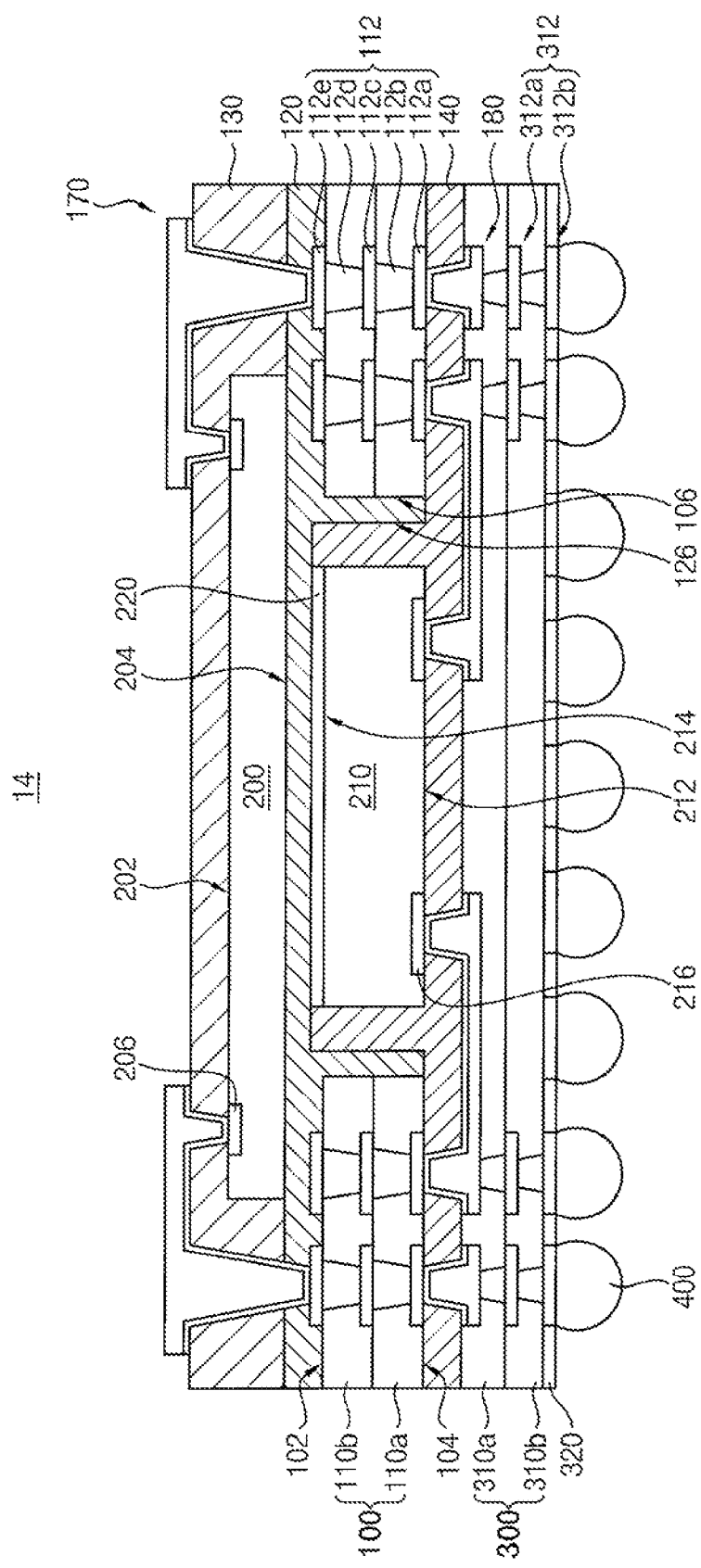
FIG. 33 is a cross-sectional view illustrating a semiconductor package in accordance with an example embodiment.

FIG. 33 is a cross-sectional view illustrating a semiconductor package in accordance with an example embodiment. The semiconductor package may be substantially the same as or similar to the semiconductor package described with reference to FIG. 1 except for arrangements of first and second semiconductor chips and a configuration of a third molding member. Thus, same reference numerals will be used to refer to the same or like elements and further repetitive explanation concerning the above elements may be omitted.

Referring to FIG. 33, a first molding member 120 of a semiconductor package 14 may include a first portion covering a first surface 102 of a core substrate 100, a second portion covering an inner sidewall of a through hole 106 of the core substrate 100 and a third portion covering a middle region of a second surface 204 of a first semiconductor chip 200.

In an example embodiment, a cavity 126 may extend in a thickness direction from a second surface 104 of the core substrate 100 to a predetermined depth. A sidewall of the cavity 126 may be defined by an outer side surface of the second portion of the first molding member 120, and a bottom surface of the cavity 126 (the bottom being inverted relative to FIG. 33, as described in connection with FIGS. 34 and 35, below) may be defined by a surface of the third portion of the first molding member 120.

A second semiconductor chip 210 may be arranged within the cavity 126 of the first molding member 120. The second semiconductor chip 210 may be adhered on the bottom surface of the cavity 126 by an adhesive film 220. Accordingly, the third portion of the first molding member 120 may be interposed between the first semiconductor chip 200 and the second semiconductor chip 210.

Hereinafter, a method of manufacturing the semiconductor package in FIG. 33 will be described.

Figure 34:
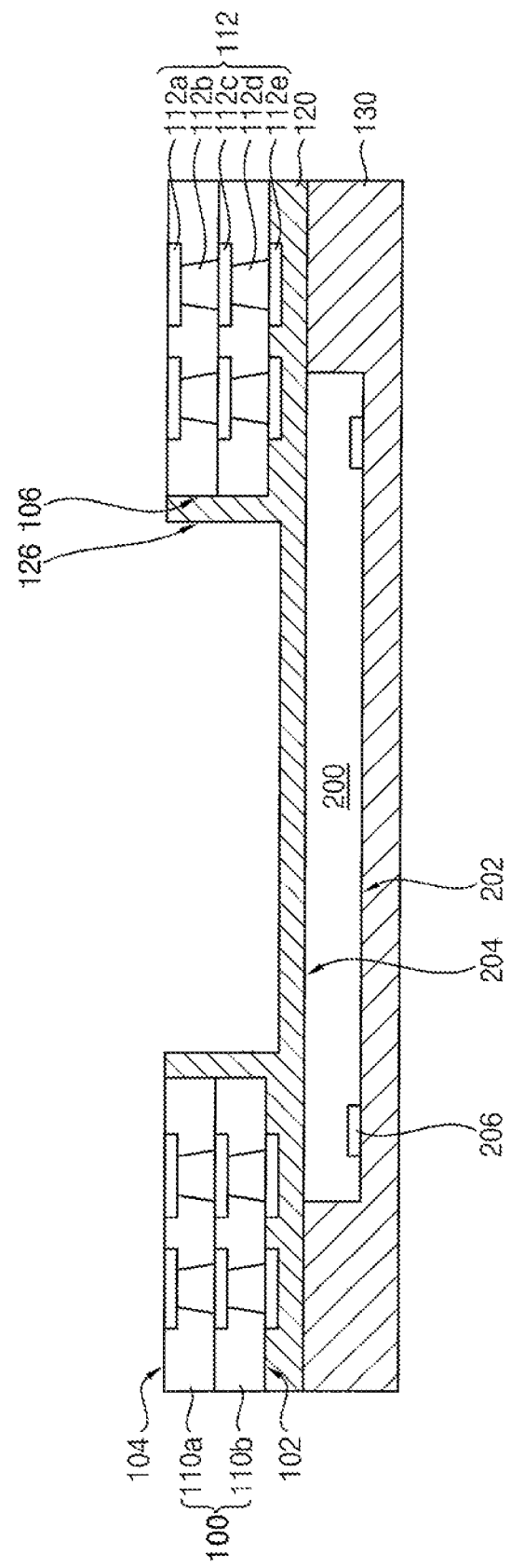
FIGS. 34 and 35 are cross-sectional views illustrating stages in a method of manufacturing a semiconductor package in accordance with an example embodiment.
Figure 35:
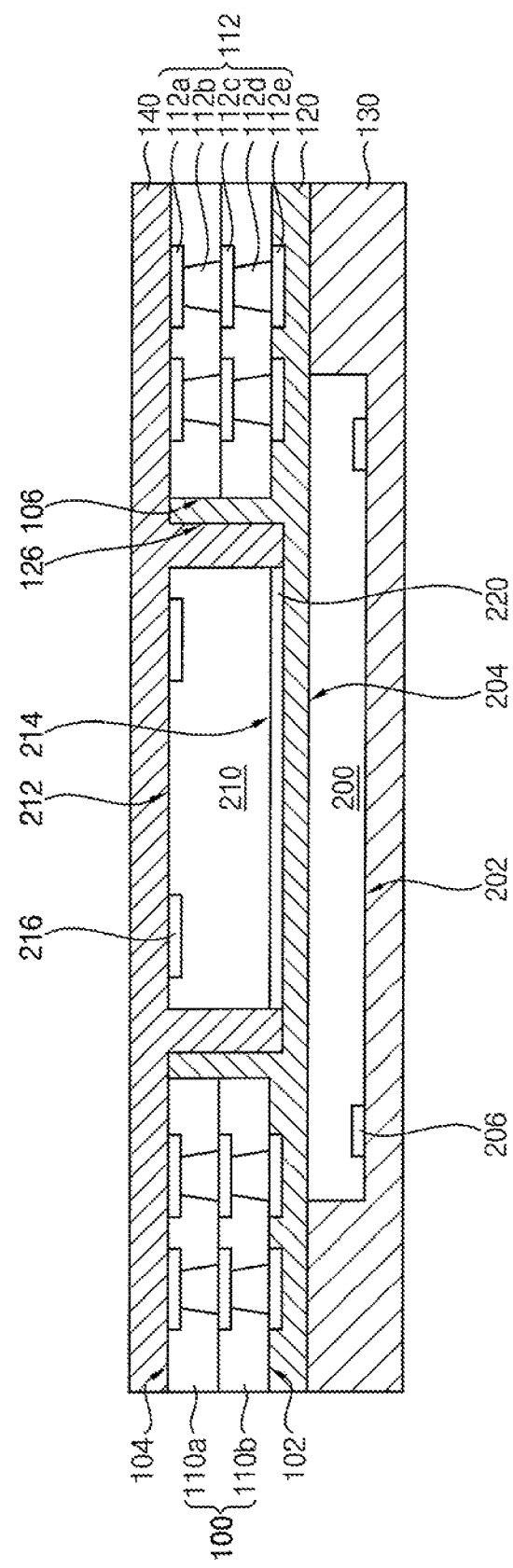

FIGS. 34 and 35 are cross-sectional views illustrating stages in a method of manufacturing a semiconductor package in accordance with an example embodiment.

Referring to FIG. 34, first, processes the same as or similar to the processes described with reference to FIGS. 4 to 8 may be performed, the structure in FIG. 8 may be reversed or inverted, and then, a cavity 126 may be formed in a first molding member 120. For example, a laser ablation process may be performed on a second surface 124 of the first molding member 120 exposed through a through hole 106 to form the cavity 126 in the first molding member 120. To form the cavity 125, the laser ablation process may be performed and then stopped before reaching a second surface 204 of a first semiconductor chip 200, such that the cavity 126 has a bottom surface and has a predetermined depth in a thickness direction from a second surface 104 of the core substrate 100. Thus, a first portion of the first molding member 120 may be formed on a first surface 102 of the core substrate 100, a second portion of the first molding member 120 may be formed on the inner sidewall of the through hole 106 of the core substrate 100, and a third portion of the first molding member 120 may be formed on a middle region of the second surface 204 of the first semiconductor chip 200.

Referring to FIG. 35, a second semiconductor chip 210 may be arranged within the cavity 126 of the first molding member 120, and then, a third molding member 140 may be formed on a second surface 104 of the core substrate 100 to cover the second semiconductor chip 210.

The second semiconductor chip 210 may be arranged within the cavity 126 of the first molding member 120. The second semiconductor chip 210 may be adhered on the bottom surface of the cavity 126 by an adhesive film 220. Accordingly, the third portion of the first molding member 120 may be interposed between the first semiconductor chip 200 and the second semiconductor chip 210.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

As described above, embodiments relate to a fan-out panel level package and a method of manufacturing the same. Embodiments may provide a fan-out semiconductor package capable of reducing manufacturing costs and having a stack package structure.

According to example embodiments, a semiconductor package as a fan-out panel level package may include a core substrate provided in an outer region of a second semiconductor chip and a lower redistribution wiring layer covering a lower surface of the core substrate. The semiconductor package as a stack package may include a first semiconductor chip stacked on the second semiconductor chip.

Thus, the semiconductor package may be provided as a stack package including the first and second semiconductor chips stacked via the core substrate as a support frame for the fan-out panel level package. The first and second semiconductor chips may be electrically connected to each other through first and second redistribution wirings on a front side and a backside of the core substrate so that signal transmission lengths are shortened to thereby optimize signal integrity (SI).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first molding member having an upper surface and a lower surface opposite to each other, the first molding member having a cavity that extends from the lower surface of the first molding member to a predetermined depth;
a first semiconductor chip on the upper surface of the first molding member;
a second semiconductor chip within the cavity, wherein a first surface of the second semiconductor chip on which second chip pads are formed is exposed from the lower surface of the first molding member;
a second molding member on the upper surface of the first molding member and covering the first semiconductor chip;
a third molding member on the lower surface of the first molding member, the third molding member filling the cavity and covering the first surface of the second semiconductor chip;
first redistribution wirings on the second molding member and electrically connected to first chip pads of the first semiconductor chip;
second redistribution wirings on the third molding member and electrically connected to the second chip pads of the second semiconductor chip;
a lower redistribution wiring layer on the third molding member and having lower redistribution wirings electrically connected to the second redistribution wirings, respectively; and
connection wirings electrically connecting the first redistribution wirings and the second redistribution wirings.

2. The semiconductor package of claim 1, wherein at least one of the first, second, and third molding members includes a photo imageable dielectric material.

3. The semiconductor package of claim 1, wherein the cavity penetrates through the first molding member.

4. The semiconductor package of claim 1, wherein a portion of the first molding member is interposed between the first semiconductor chip and the second semiconductor chip.

5. The semiconductor package of claim 1, wherein a portion of the third molding member filling the cavity is in direct contact with the first semiconductor chip.

6. The semiconductor package of claim 1, wherein the connection wirings are provided in a region outside an area where the second semiconductor chip is disposed.

7. The semiconductor package of claim 1, wherein a second surface of the first semiconductor chip, which is opposite to a first surface on which the first chip pads are formed, faces a second surface of the second semiconductor chip, which is opposite to the first surface on which the second chip pads are formed.

8. The semiconductor package of claim 7, wherein:
an adhesive film is interposed between the second surface of the first semiconductor chip and the second surface of the second semiconductor chip, and
the adhesive film is in direct contact with the second surface of the first semiconductor chip and is in direct contact with the second surface of the second semiconductor chip.

9. The semiconductor package of claim 1, wherein the first redistribution wirings include bonding wires, and the second molding member further includes a portion covering the bonding wires.

10. The semiconductor package of claim 1, further comprising:
an upper redistribution wiring layer on the second molding member and having upper redistribution wirings electrically connected to the first redistribution wirings.

11. A semiconductor package, comprising:
a lower redistribution wiring layer having first lower redistribution wirings;
first redistribution wirings on the lower redistribution wiring layer and electrically connected to the first lower redistribution wirings;
a first molding member on the lower redistribution wiring layer;
a first semiconductor chip on the first molding member, first chip pads of the first semiconductor chip being electrically connected to the first redistribution wirings through openings formed in the first molding member;
a second molding member on the first molding member, the second molding member having a cavity in which the first semiconductor chip is arranged;
a second semiconductor chip on the first semiconductor chip and on the second molding member, wherein the cavity extends from a lower surface of the second molding member to a predetermined depth, and a portion of the second molding member is interposed between the first semiconductor chip and the second semiconductor chip;
a third molding member on the second molding member and covering the second semiconductor chip;
second redistribution wirings on the third molding member, second chip pads of the second semiconductor chip being electrically connected to the second redistribution wirings; and
connection wirings provided in a region outside an area where the first semiconductor chip is disposed and electrically connecting the first redistribution wirings and the second redistribution wirings.

12. The semiconductor package of claim 11, wherein a portion of the first molding member fills the cavity.

13. The semiconductor package of claim 12, wherein the portion of the first molding member filling the cavity is in direct contact with the second semiconductor chip.

14. The semiconductor package of claim 11, wherein the cavity penetrates through the second molding member.

15. The semiconductor package of claim 11, wherein at least one of the first, second, and third molding members includes a photo imageable dielectric material.

16. The semiconductor package of claim 11, wherein a second surface of the second semiconductor chip, which is opposite to a first surface on which the second chip pads are formed, faces a second surface of the first semiconductor chip, which is opposite to a first surface on which the first chip pads are formed.

17. The semiconductor package of claim 16, wherein an adhesive film is interposed between the second surface of the second semiconductor chip and the second surface of the first semiconductor chip, and
the adhesive film is in direct contact with the second surface of the second semiconductor chip and is in direct contact with the second surface of the first semiconductor chip.

18. The semiconductor package of claim 11, wherein the second redistribution wirings include bonding wires, and the third molding member further includes a portion covering the bonding wires.

19. The semiconductor package of claim 11, further comprising:
an upper redistribution wiring layer on the third molding member and having upper redistribution wirings electrically connected to the second redistribution wirings.

* * * * *